United States Patent [19]
Doi et al.

[11] Patent Number: 5,590,268
[45] Date of Patent: Dec. 31, 1996

[54] SYSTEM AND METHOD FOR EVALUATING A WORKSPACE REPRESENTED BY A THREE-DIMENSIONAL MODEL

[75] Inventors: Miwako Doi; Mika Fukui; Ikiko Nishida; Nobuko Kato, all of Kanagawa-ken, Japan

[73] Assignee: Kabushiki Kaisha Toshiba, Kawasaki, Japan

[21] Appl. No.: 220,180

[22] Filed: Mar. 30, 1994

[30] Foreign Application Priority Data

Mar. 31, 1993 [JP] Japan .................... 5-074716

[51] Int. Cl.⁶ .............. G06F 3/00; G06T 17/00
[52] U.S. Cl. .......... 395/326; 395/119; 395/127; 395/120; 364/578
[58] Field of Search .................. 395/155, 161, 395/159, 119, 127, 120, 152; 345/139, 157, 156; 364/578

[56] References Cited

U.S. PATENT DOCUMENTS

| | | | |
|---|---|---|---|
| 4,375,674 | 3/1983 | Thornton | 395/119 X |
| 4,970,666 | 11/1990 | Welsh et al. | 395/127 X |
| 5,138,698 | 8/1992 | Aldrich et al. | 395/127 |
| 5,276,785 | 1/1994 | Mackinlay et al. | 395/127 |
| 5,305,429 | 4/1994 | Sato et al. | 395/119 |
| 5,310,349 | 5/1994 | Daniels et al. | 395/161 X |
| 5,333,257 | 7/1994 | Merrill et al. | 395/161 |
| 5,339,390 | 8/1994 | Robertson et al. | 395/161 X |
| 5,432,895 | 7/1995 | Myers | 395/119 |

*Primary Examiner*—Raymond J. Bayerl
*Attorney, Agent, or Firm*—Oblon, Spivak, McClelland, Maier & Neustadt, P.C.

[57] ABSTRACT

An evaluation system which can quantitatively evaluate a virtually produced workspace by adequately providing conditions of an operator and the workspace. The system calculates a motion of the operator on the basis of the input conditions of the operator and the workspace, and a task sequence in the workspace, and displays data for evaluation of the calculated motion of the operator.

39 Claims, 30 Drawing Sheets

FIG. 2

| OBJECT | CENTRAL COORDINATE | BOUNDARY BOX | POINT FOR SHAPE DATA |
|---|---|---|---|
| MONITOR A | $(x_0, y_0, z_0)$ | $(x_{01}, y_{01}, z_{01})$ $(x_{02}, y_{02}, z_{02})$ $(x_{03}, y_{03}, z_{03})$ $(x_{04}, y_{04}, z_{04})$ $(x_{05}, y_{05}, z_{05})$ $(x_{06}, y_{06}, z_{06})$ $(x_{07}, y_{07}, z_{07})$ $(x_{08}, y_{08}, z_{08})$ | $P_0$ |
| MONITOR B | $(x_1, y_1, z_1)$ | $(x_{11}, y_{11}, z_{11})$ $(x_{12}, y_{12}, z_{12})$ $(x_{13}, y_{13}, z_{13})$ $(x_{14}, y_{14}, z_{14})$ $(x_{15}, y_{15}, z_{15})$ $(x_{16}, y_{16}, z_{16})$ $(x_{17}, y_{17}, z_{17})$ $(x_{18}, y_{18}, z_{18})$ | $P_1$ |
| INPUT PANEL | $(x_2, y_2, z_2)$ | $(x_{21}, y_{21}, z_{21})$ $(x_{22}, y_{22}, z_{22})$ $(x_{23}, y_{23}, z_{23})$ $(x_{24}, y_{24}, z_{24})$ $(x_{25}, y_{25}, z_{25})$ $(x_{26}, y_{26}, z_{26})$ $(x_{27}, y_{27}, z_{27})$ $(x_{28}, y_{28}, z_{28})$ | $P_2$ |
| PATIENT | $(x_3, y_3, z_3)$ | $(x_{31}, y_{31}, z_{31})$ $(x_{32}, y_{32}, z_{32})$ $(x_{33}, y_{33}, z_{33})$ $(x_{34}, y_{34}, z_{34})$ | $P_3$ |

FIG. 3

| SEQUENCE | GAZE POINT |
|---|---|
| 1 | MONITOR A |
| 2 | PATIENT |
| 3 | INPUT PANEL |
| 4 | MONITOR B |
|  |  |

FIG. 4

|  |  | LIMITING ROTATION ANGLE | LIMITING MOVEMENT DISTANCE |
|---|---|---|---|
| EYE | | X AXIS UPWARD $\phi u$ | $\Sigma$ |
| | | X AXIS DOWNWARD $\phi d$ | $\Sigma$ |
| | | Y AXIS LEFTWARD $\phi \ell$ | $\Sigma$ |
| | | Y AXIS RIGHTWARD $\phi r$ | $\Sigma$ |
| NECK | | X AXIS UPWARD $\alpha u$ | 0 |
| | | X AXIS DOWNWARD $\alpha d$ | 0 |
| | | Y AXIS LEFTWARD $\beta \ell$ | 0 |
| | | Y AXIS RIGHTWARD $\beta r$ | 0 |
| | | Z AXIS LEFTWARD $\tau \ell$ | 0 |
| | | Z AXIS RIGHTWARD $\tau r$ | 0 |
| WAIST | | X AXIS UPWARD $\delta u$ | $xu$ |
| | | X AXIS DOWNWARD $\tau d$ | $xd$ |
| | | Y AXIS LEFTWARD $\varepsilon \ell$ | $y\ell$ |
| | | Y AXIS RIGHTWARD $\varepsilon r$ | $yr$ |
| | | Z AXIS LEFTWARD $\phi \ell$ | $y\ell$ |
| | | Z AXIS RIGHTWARD $\phi r$ | $yr$ |
| HALF-SITTING POSTURE | | | |
| WALKING | | | |

- NO. OF INTERFERENCE
- NO. OF GAZING OPERATIONS
- NO. OF ROTATIONS
- NO. OF MOVEMENTS

DISPLAY OF VIEW FIELD

FIG. 22

| OBJECT | CENTRAL COORDINATE | BOUNDARY BOX | POINT FOR SHAPE DATA |
|---|---|---|---|
| MONITOR A | $(x_0, y_0, z_0)$ | $(x_{01}, y_{01}, z_{01})$ $(x_{02}, y_{02}, z_{02})$<br>$(x_{03}, y_{03}, z_{03})$ $(x_{04}, y_{04}, z_{04})$<br>$(x_{05}, y_{05}, z_{05})$ $(x_{06}, y_{06}, z_{06})$<br>$(x_{07}, y_{07}, z_{07})$ $(x_{08}, y_{08}, z_{08})$ | $P_0$ |
| MONITOR B | $(x_1, y_1, z_1)$ | $(x_{11}, y_{11}, z_{11})$ $(x_{12}, y_{12}, z_{12})$<br>$(x_{13}, y_{13}, z_{13})$ $(x_{14}, y_{14}, z_{14})$<br>$(x_{15}, y_{15}, z_{15})$ $(x_{16}, y_{16}, z_{16})$<br>$(x_{17}, y_{17}, z_{17})$ $(x_{18}, y_{18}, z_{18})$ | $P_1$ |
| INPUT PANEL | $(x_2, y_2, z_2)$ | $(x_{21}, y_{21}, z_{21})$ $(x_{22}, y_{22}, z_{22})$<br>$(x_{23}, y_{23}, z_{23})$ $(x_{24}, y_{24}, z_{24})$<br>$(x_{25}, y_{25}, z_{25})$ $(x_{26}, y_{26}, z_{26})$<br>$(x_{27}, y_{27}, z_{27})$ $(x_{28}, y_{28}, z_{28})$ | $P_2$ |
| BUTTON | $(x_3, y_3, z_3)$ | $(x_{31}, y_{31}, z_{31})$ $(x_{32}, y_{32}, z_{32})$<br>$(x_{33}, y_{33}, z_{33})$ $(x_{34}, y_{34}, z_{34})$ | $P_3$ |

FIG.23

| | POSTURE | REACHABLE ANGLE | | | | | |
|---|---|---|---|---|---|---|---|
| | | X AXIS UPWARD | X AXIS DOWNWARD | Y AXIS LEFTWARD | Y AXIS RIGHTWARD | Z AXIS LEFTWARD | Z AXIS RIGHTWARD |
| SHOULDER | STANDING POSITION | $\alpha_{1u}$ | $\alpha_{1d}$ | $\beta_{1\ell}$ | $\beta_{1r}$ | $\tau_{1\ell}$ | $\tau_{1r}$ |
| | SITTING POSITION | $\alpha_{2u}$ | $\alpha_{2d}$ | $\beta_{2\ell}$ | $\beta_{2r}$ | $\tau_{2\ell}$ | $\tau_{2r}$ |
| | NULL | $\alpha_{3u}$ | $\alpha_{3d}$ | $\beta_{3\ell}$ | $\beta_{3r}$ | $\tau_{3\ell}$ | $\tau_{3r}$ |
| ELBOW | | ~ | ~ | ~ | ~ | ~ | ~ |
| | NULL | $\delta_u$ | $\delta_d$ | $\varepsilon_\ell$ | $\varepsilon_r$ | $\phi_\ell$ | $\phi_r$ |
| WRIST | | ~ | ~ | ~ | ~ | ~ | ~ |

REACHABLE AREA CONE
(ARM AND HAND ARE SEPARATELY MOVED)

REACHABLE AREA CONE
(ARM AND HAND ARE MOVED CONJOINTLY)

FIG. 30

| OBJECT | CENTRAL COORDINATE OF OPERATION | OPERATION AREA | | OPERATION FACE VECTOR |
|---|---|---|---|---|
| MONITOR A | $(x_0, y_0, z_0)$ | $(x_{01}, y_{01}, z_{01})$ $(x_{03}, y_{03}, z_{03})$ $(x_{05}, y_{05}, z_{05})$ $(x_{07}, y_{07}, z_{07})$ | $(x_{02}, y_{02}, z_{02})$ $(x_{04}, y_{04}, z_{04})$ $(x_{06}, y_{06}, z_{06})$ $(x_{08}, y_{08}, z_{08})$ | $(N_{X0}, N_{Y0}, N_{Z0})$ |
| MONITOR B | $(x_1, y_1, z_1)$ | $(x_{11}, y_{11}, z_{11})$ $(x_{13}, y_{13}, z_{13})$ $(x_{15}, y_{15}, z_{15})$ $(x_{17}, y_{17}, z_{17})$ | $(x_{12}, y_{12}, z_{12})$ $(x_{14}, y_{14}, z_{14})$ $(x_{16}, y_{16}, z_{16})$ $(x_{18}, y_{18}, z_{18})$ | $(N_{X1}, N_{Y1}, N_{Z1})$ |
| INPUT PANEL | $(x_2, y_2, z_2)$ | $(x_{21}, y_{21}, z_{21})$ $(x_{23}, y_{23}, z_{23})$ $(x_{25}, y_{25}, z_{25})$ $(x_{27}, y_{27}, z_{27})$ | $(x_{22}, y_{22}, z_{22})$ $(x_{24}, y_{24}, z_{24})$ $(x_{26}, y_{26}, z_{26})$ $(x_{28}, y_{28}, z_{28})$ | $(N_{X2}, N_{Y2}, N_{Z2})$ |
| BUTTON | $(x_3, y_3, z_3)$ | $(x_{31}, y_{31}, z_{31})$ $(x_{33}, y_{33}, z_{33})$ | $(x_{32}, y_{32}, z_{32})$ $(x_{34}, y_{34}, z_{34})$ | $(N_{X3}, N_{Y3}, N_{Z3})$ |

FIG. 31

| OBJECT | CENTRAL COORDINATE | BOUNDING BOX | | POINTER FOR SHAPE DATA | CENTRAL COORDINATE OF OPERATION | OPERATION AREA | | OPERATION FACE VECTOR |
|---|---|---|---|---|---|---|---|---|
| MONITOR A | $(x_0, y_0, z_0)$ | $(x_{01}, y_{01}, z_{01})$ $(x_{03}, y_{03}, z_{03})$ $(x_{05}, y_{05}, z_{05})$ $(x_{07}, y_{07}, z_{07})$ | $(x_{02}, y_{02}, z_{02})$ $(x_{04}, y_{04}, z_{04})$ $(x_{06}, y_{06}, z_{06})$ $(x_{08}, y_{08}, z_{08})$ | $P_0$ | $(x_0, y_0, z_0)$ | $(x_{01}, y_{01}, z_{01})$ $(x_{03}, y_{03}, z_{03})$ $(x_{05}, y_{05}, z_{05})$ $(x_{07}, y_{07}, z_{07})$ | $(x_{02}, y_{02}, z_{02})$ $(x_{04}, y_{04}, z_{04})$ $(x_{06}, y_{06}, z_{06})$ $(x_{08}, y_{08}, z_{08})$ | $(N_{X0}, N_{Y0}, N_{Z0})$ |
| MONITOR B | $(x_1, y_1, z_1)$ | $(x_{11}, y_{11}, z_{11})$ $(x_{13}, y_{13}, z_{13})$ $(x_{15}, y_{15}, z_{15})$ $(x_{17}, y_{17}, z_{17})$ | $(x_{12}, y_{12}, z_{12})$ $(x_{14}, y_{14}, z_{14})$ $(x_{16}, y_{16}, z_{16})$ $(x_{18}, y_{18}, z_{18})$ | $P_1$ | $(x_1, y_1, z_1)$ | $(x_{11}, y_{11}, z_{11})$ $(x_{13}, y_{13}, z_{13})$ $(x_{15}, y_{15}, z_{15})$ $(x_{17}, y_{17}, z_{17})$ | $(x_{12}, y_{12}, z_{12})$ $(x_{14}, y_{14}, z_{14})$ $(x_{16}, y_{16}, z_{16})$ $(x_{18}, y_{18}, z_{18})$ | $(N_{X1}, N_{Y1}, N_{Z1})$ |
| INPUT PANEL | $(x_2, y_2, z_2)$ | $(x_{21}, y_{21}, z_{21})$ $(x_{23}, y_{23}, z_{23})$ $(x_{25}, y_{25}, z_{25})$ $(x_{27}, y_{27}, z_{27})$ | $(x_{22}, y_{22}, z_{22})$ $(x_{24}, y_{24}, z_{24})$ $(x_{26}, y_{26}, z_{26})$ $(x_{28}, y_{28}, z_{28})$ | $P_2$ | $(x_2, y_2, z_2)$ | $(x_{21}, y_{21}, z_{21})$ $(x_{23}, y_{23}, z_{23})$ $(x_{25}, y_{25}, z_{25})$ $(x_{27}, y_{27}, z_{27})$ | $(x_{22}, y_{22}, z_{22})$ $(x_{24}, y_{24}, z_{24})$ $(x_{26}, y_{26}, z_{26})$ $(x_{28}, y_{28}, z_{28})$ | $(N_{X2}, N_{Y2}, N_{Z2})$ |
| BUTTON | $(x_3, y_3, z_3)$ | $(x_{31}, y_{31}, z_{31})$ $(x_{33}, y_{33}, z_{33})$ | $(x_{32}, y_{32}, z_{32})$ $(x_{34}, y_{34}, z_{34})$ | $P_3$ | $(x_3, y_3, z_3)$ | $(x_{31}, y_{31}, z_{31})$ $(x_{33}, y_{33}, z_{33})$ | $(x_{32}, y_{32}, z_{32})$ $(x_{34}, y_{34}, z_{34})$ | $(N_{X3}, N_{Y3}, N_{Z3})$ |

FIG. 33

| SEQUENCE | GAZE POINT | OPPERATION POINT |
|---|---|---|
| 1 | MONITOR A | KEY BOARD |
| 2 | BUTTON | KEY BOARD |
| 3 | INPUT PANEL | KEY BOARD |
| 4 | MONITOR B | KEY BOARD |

FIG. 35

| JOINT | ANGLE | LIMITING PERIOD (MIN.) | LIMITING FREQUENCY | FATIGUE | SYMPTOM | |
|---|---|---|---|---|---|---|
| WAIST (SITTING POSTURE) | X AXIS DOWNWARD $f_1$ | $t_1$ | $n_1$ | 1 | REACHABLE ANGLE $-\phi_1$ | BENUMB |
| | X AXIS DOWNWARD $f_2$ | $t_2$ | $n_2$ | 2 | No. ACTIVE. | ACHE |
| | ~ | ~ | ~ | ~ | ~ | ~ |
| KNEE (STANDING POSTURE) | X AXIS DOWNWARD 0 | $t_3$ | $n_3$ | 1 | REACHABLE ANGLE $-\phi_1$ | BENUMB |
| ~ | ~ | ~ | ~ | ~ | ~ | ~ |
| ~ | ~ | ~ | ~ | ~ | ~ | ~ |

FIG. 36

HEIGHT: ℓ cm, CHAIR: h cm SITTING POSTURE

| PART \ ROTATION ANGLE | $<f_1$ MIN. | $<f_1$ TIMES | $f_1 \sim f_1$ MIN. | $f_1 \sim f_1$ TIMES | $f_2>$ MIN. | $f_2>$ TIMES | | |
|---|---|---|---|---|---|---|---|---|
| WAIST | 15 | 8 | 5 | 6 | 0.5 | 3 | ∫ | ∫ |
| KNEE | 0 | 0 | $<f_3$ 0 | 0 | $<f_4>$ 20 | 0 | ∫ ∫ | ∫ ∫ |

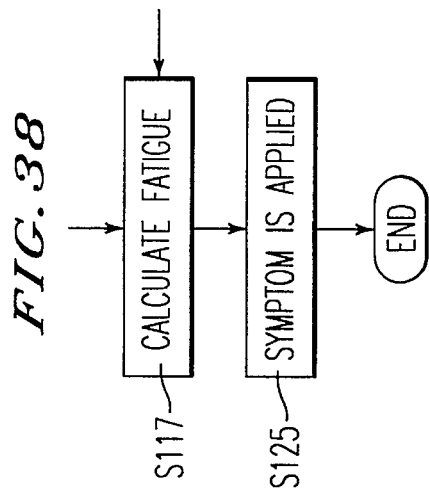
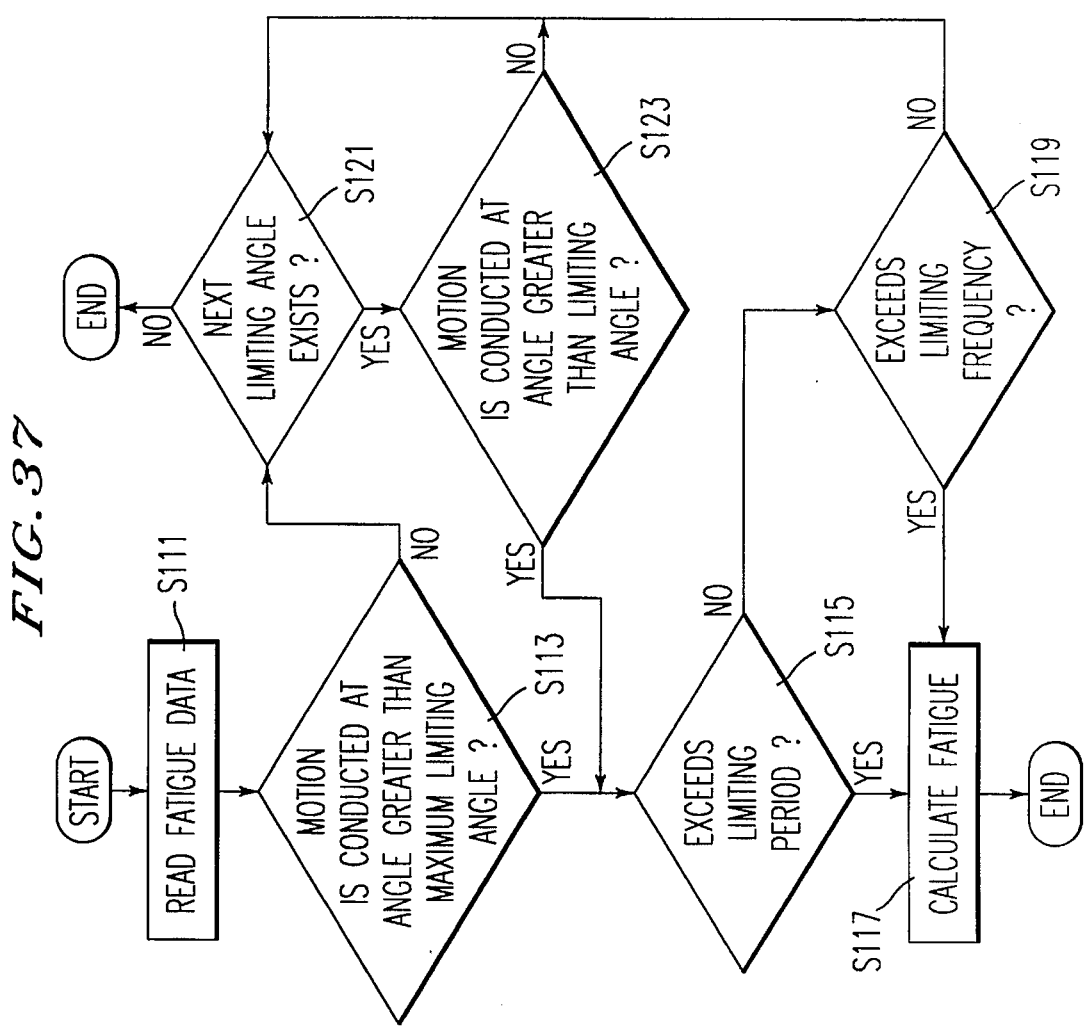

SYSTEM AND METHOD FOR EVALUATING A WORKSPACE REPRESENTED BY A THREE-DIMENSIONAL MODEL

BACKGROUND OF THE INVENTION

1. Field of the Invention

The invention relates to an evaluation system and method for quantitatively evaluating a workspace such as a workplace, a monitor room, a control room, or an office which is represented by a three-dimensional model.

2. Description of the Background Art

Conventionally, a monitor room for monitoring and controlling a power plant or a factory, an office where a number of word processors and the like are used, an operating room for a medical appliance such as a CT (Computed Tomography) scanner, or a moving facility such as an elevator, or an escalator installed in a public location is designed on the basis of sketches which show the interior of a room where desks, chairs, etc. are arranged and which are drawn by a designer from various viewpoints.

In a design of a monitor and control room, items to be checked include whether or not an operator sitting at a supervisor control panel can see a large screen on a wall without being obstructed by the control panel, and whether or not the accommodation feeling is sufficient. In a design of an operating room for a medical appliance, items to be checked include whether or not an operator can operate the appliance while seeing a patient, and whether or not a doctor can see a picked up image without hindering the motion of the operator.

The designer must draw sketches while considering these items to be checked. Furthermore, the designer must also consider that operators or supervisors are different in height. Particularly in the case of a medical appliance, not only a male operator but also a female operator operates it, and therefore such an appliance must correspond to a height range from 150 cm to 180 cm or more. Using sketches in a design, however, it is substantially impossible to check the items from arbitrary viewpoints.

In a design of a moving facility such as an elevator, conventional checks using sketches cannot permit judgement on whether or not an adult, a child, and a person using a wheelchair can select floor buttons without trouble, and whether or not there is a gap difference which may obstruct a movement of a wheelchair, in a passage from a gate to the elevator. Furthermore, in the method using sketches, it is impossible to judge whether or not a situation where only a child is on an escalator can be recognized from a place lower than the escalator. In the prior art method using sketches, furthermore, it is impossible to study the degree of inclination which is produced when a wheelchair is on a descending escalator, and the degree of a sensation of fear due to the inclination by a person in the wheelchair.

In addition to the above-mentioned items, items to be checked in a design further include important ones which cannot easily be judged in the method using sketches. For example, whether or not a child or a person using a wheelchair can see position indicator lamps of an elevator or the like, and what kinds of discomfort a child or a short person in a crowded elevator or train must endure (for example, the face is pressed against the back or long hair of another person).

In order to solve these problems in a design check using sketches, a design check using computer graphics has recently been conducted. In a design check using computer graphics, a CAD (Computer Aided Design) or the like is used in place of sketches, so that three-dimensional models of objects such as a supervisor control panel, a desk, and a chair are input to be arranged in a three-dimensional space. In computer graphics, a three-dimensional space can be seen as a perspective view in an arbitrary viewpoint. Using this feature, it is possible to check a design in an arbitrary viewpoint. Furthermore, it is being studied to employ the virtual reality (VR) technique wherein objects disposed in a three-dimensional space produced by computer graphics are moved by using a device such as a data glove which can indicate the shape of fingers and the three-dimensional position of a hand.

In such a position change according to the virtual reality, a supervisor control panel, a desk, and the like can be moved to an arbitrary position. However, it is impossible to clearly indicate the point in which the alternative arrangement obtained as a result of the position change is superior to other arrangements. There is nothing to qualitatively evaluate these arrangements by comparing perspective views on which these arrangements are shown as pictures.

In another method, a mock-up of a scale of $\frac{1}{10}$ is produced, and views are picked up by a CCD (charge-coupled device) to verify actual views. Since the viewpoint cannot be moved to an arbitrary position and displays on a large screen must be imitated by drawings printed on papers, however, this method has a drawback that visibility or sight distance cannot be evaluated. With respect to a computer display screen, therefore, simulation for display evaluation is separately produced by a computer, and the evaluation is conducted on the basis of this simulation. In this way, works on a computer display screen and an actual workspace are separately evaluated.

On the other hand, in the field of the human factors or ergonomics, there is an analysis method in which an operator in the spot is observed, motions of the operator are recorded in the form of motion lines, and the analysis is conducted on the basis of the recorded motion lines. According to this method, motions peculiar to the operator can be analyzed. However, the method cannot anticipate differences in motion due to a body part size such as the height. When a short operator conducts a work, for example, a supervisor control panel obstructs the view of a large screen, resulting in that the operator must conduct motions of rising from and sitting on a chair more often than when an average-height operator conducts the same work. Moreover, for the workspace which is newly designed, there is no actual work place where such observation can be conducted. Therefore, this analysis method cannot be applied to such a workspace. In some cases, an actual-size model of a workspace is produced and so-called actual-size simulation is conducted by using the model. In such actual-size simulation, experiments must be conducted on many subjects of various body sizes, and therefore it is anticipated that it requires great expense. Accordingly, such actual-size simulation may be used in a large-scale design, but not in a small-scale design such as a design of a kitchen. In a workspace of a medical appliance, doctors are so busy that it is difficult to make the doctors join in actual-size simulation and obtain comments or suggestions from them. Similarly, it is difficult to make persons using a wheelchair and children take part in actual-size simulation and obtain comments from them.

In the field of the human factors, known are a keystroke-level model for anticipating a time required for a very skilled operator to operate a keyboard (Card, S. K., Moran, T. P., and Newell, A. (1980), "The keystroke-level model for user performance time with interactive systems," Communications of the ACM, 23, pp. 396–410), and a GOMS (Goals Operators Methods and Selection-rules) model for anticipating actions of a user conducted when editing a text (Card, S. K., Moran, T. P., and Newell, A. (1983), "The Psychology of Human Computer Interaction," Hillsdale, N.J.: Erlbaum).

These are models or evaluation methods for a very restricted portion of works which are conducted facing a computer. When an alternative of an arrangement of a workspace is to be comparatively evaluated, an evaluation model or an evaluation technique for all the works conducted in the whole workspace which include not only works conducted facing a computer but also document works conducted at the side of the computer, and works accompanied by movement of the body is required. Therefore, a conventional model or evaluation method cannot evaluate an alternative of an arrangement of a workspace.

In order to analyze the point of a computer screen at which the operator gazes while conducting a work, furthermore, a measuring method is employed in which physical viewpoint movement is recorded by a device such as an eye-mark-recorder and the movement is analyzed. In another method, the physiologic fatigue is measured after using a computer by a flicker test or the like. However, fatigue data which are collected in these methods remain simply as experimental data and are seldom reused as evaluation data for an actual design.

When summarizing the above-discussed problems, there are four problems in the prior art:

(1) In the prior art techniques using sketches, computer graphics, or the virtual reality, it is impossible to quantitatively evaluate an alternative of an arrangement of a workspace. Also, it is impossible to evaluate inconvenience, discomfort, and the like which are produced in an actual work.

(2) Models which are used in the field of the human factors are restricted to works which are conducted facing a computer, and therefore cannot be used to quantitatively evaluate an alternative of an arrangement of a workspace while considering all the works conducted in the whole workspace which include not only works conducted facing a computer but also document works conducted at the side of the computer, and works accompanied by movement of the body, and on the basis of differences in the body part size and in the standpoint of the operator.

(3) The analyzing technique is conducted on an operator in an existing workspace, and therefore cannot be applied to a workspace which will be created (or which does not exist). When an actual-size model of a workspace is produced and a motion analysis is conducted, experiments must be conducted on many subjects of various body sizes, and therefore it requires many labors and great expense. Furthermore, it is substantially impossible to conduct actual-size simulation on busy doctors, etc.

(4) Collected fatigue data are experimental data in any case, and cannot be used positively in an estimation of the fatigue, etc. due to the frequency and duration period of motions, because devices are arranged in different manner and the kinds of motions cannot be anticipated.

SUMMARY OF THE INVENTION

Accordingly, an object of the present invention is to provide an evaluation system and method which solve the above-discussed problems.

It is another object of the invention to provide an evaluation system and method which quantitatively conduct evaluation on the basis of data which are obtained from motions of an operator (model) working in a workspace represented by a three-dimensional space.

It is a further object of the invention to provide an evaluation system and a method which suggest a workspace conforming to motions of an operator working in a workspace represented by a three-dimensional space.

It is a still further object of the invention to provide an evaluation system and method which conduct evaluation on, for example, whether or not a predetermined motion can be done in accordance with a change of physical features of an operator working in a workspace represented by a three-dimensional space.

It is a still further object of the invention to provide an evaluation system and method which quantitatively evaluate an alternative of an arrangement of a device in a workspace represented by a three-dimensional space where a predetermined operator works.

It is a still further object of the invention to provide an evaluation system and method which estimate and evaluate the fatigue of an operator working in a workspace represented by a three-dimensional space which fatigue is due to the difference in arrangement of a device.

According to one aspect of the present invention there is provided a system of evaluating a workspace wherein various objects are arranged, by causing a predetermined operator model to conduct a motion in the workspace, said workspace being virtually produced, said system comprising: first setting means for setting a sequence in which the operator model conducts a motion in the workspace, and an object to which the operator model is to gaze when the operator model conducts a motion in accordance with the sequence; and display means for visibly displaying a visual field area on a screen for each object which is set by said first setting means, said visual field area being obtained when the operator model gazes at the object.

According to another aspect of the present invention there is provided a system of evaluating a workspace wherein various objects are arranged, by causing a predetermined operator model to conduct a motion in the workspace, said workspace being virtually produced, said system comprising: definition means for defining a task sequence of the operator model in the workspace; execution means for executing the task sequence defined by said definition means; designation means for designating an object to which the operator model caused to conduct a motion by said execution means is to gaze; counting means for, when the operator model gazes at an object designated by said designation means in a task defined by said definition means, counting the number of interferences which are produced on the object by another object; and display means for displaying a counting result obtained by said counting means.

According to further aspect of the present invention there is provided a system of evaluating a workspace wherein various objects are arranged, by causing a predetermined operator model to conduct a motion in the workspace, said workspace being virtually produced, said system comprising: definition means for defining a motion of the operator model in the workspace; execution means for executing the motion defined by said definition means; and reexecution means for, when an arrangement of the various objects is changed, when the operator model is changed, or when a motion of the operator model is changed, newly executing a motion which is defined on the basis of the change.

According to still a further aspect of the present invention there is provided a system of evaluating a workspace wherein various objects are arranged, by causing a predetermined operator model to conduct a motion in the workspace, said workspace being virtually produced, said system comprising: first definition means for defining a reachable area of each part of the operator model; second definition means for defining a motion of the operator model in the workspace with respect to an object to be reached which is one of the objects; execution means for executing the motion of the operator model which is defined by said second definition means; judging means for, when said execution means executes the motion of the operator model, judging whether or not the object to be reached is within the reachable area defined by said first definition means; and display means for displaying a judging result of said judging means.

According to still a further aspect of the present invention there is provided a system of evaluating a workspace wherein various objects are arranged, by causing a predetermined operator model to conduct a motion in the workspace, said workspace being virtually produced, said system comprising: definition means for defining a motion of the operator model in the workspace with respect to the various objects; execution means for executing the motion defined by said definition means; classifying and measuring means for classifying motions executed by said execution means by kinds of motions, and for measuring the number of motions (frequency) for each of the classified motions and/or a duration period of each motion; and display means for displaying a result of said classifying and measuring means.

According to still a further aspect of the present invention there is provided a system of evaluating a workspace wherein various objects are arranged, by causing a predetermined operator model to conduct a motion in the workspace, said workspace being virtually produced, said system comprising: input means for inputting conditions relating to the operator model and the workspace; condition storing means for storing conditions which are input through said input means; sequence input means for inputting a task sequence in the workspace; sequence storing means for storing the task sequence which is input through said sequence input means; motion calculation means for calculating a motion of the operator model on the basis of the task sequence stored in said sequence storing means and conditions stored in said condition storing means; and display means for displaying the workspace with respect to a motion of the operator model which is calculated by said motion calculation means.

According to still a further aspect of the present invention there is provided a system of evaluating a workspace wherein various objects are arranged, by causing a predetermined operator model to conduct a motion in the workspace, said workspace being virtually produced, said system comprising: input means for inputting conditions relating to the operator model and the workspace; condition storing means for storing conditions which are input through said input means; sequence input means for inputting a task sequence in the workspace; sequence storing means for storing a sequence which is input through said sequence input means; interference judging means for conducting an interference check on a visual field of the operator model and an interference target on the basis of a task sequence stored in said sequence storing means and conditions stored in said condition storing means; interference counting means for counting the number of interferences which are judged by said interference judging means for each of the interference targets stored in said condition storing means; and display means for displaying a count result of said interference counting means.

According to still a further aspect of the present invention there is provided a system of evaluating a workspace wherein various objects are arranged, by causing a predetermined virtual subject to conduct a motion in the workspace, said workspace being virtually produced, said system comprising: condition storing means for storing: workspace data which include a shape of at least one object constituting the workspace, an arrangement of said object, and a shape of the workspace where said object is disposed; and virtual subject data which include an arrangement and a shape of a virtual subject conducting a work in the workspace, and a knowledge for generating a motion; display means for displaying the workspace and the virtual subject; designation means for designating one object which is to be operated by the virtual subject in the workspace, or plural objects which are to be operated by the virtual subject and sequence of said plural objects; and operability judging means for judging whether or not the virtual subject can operate the object designated by said designation means.

According to still a further aspect of the present invention there is provided a system of evaluating a workspace wherein various objects are arranged, by causing a predetermined virtual subject to conduct a motion in the workspace, said workspace being virtually produced, said system comprising: condition storing means for storing data which include a shape of at least one object constituting the workspace, an arrangement of said object, and a shape of the workspace where said object is disposed; and virtual subject data which include an arrangement and a shape of a virtual subject conducting a work in the workspace, and a knowledge for generating a motion; display means for displaying the workspace and the virtual subject; work designation means for designating one work in the workspace, or plural works and a sequence of said plural works; motion generation means for generating a motion of the virtual subject in accordance with a work indicted through said work designation means; motion measuring means for measuring the frequency for each kind of motions generated by said motion generation means, and a duration period of each motion; fatigue data storing means for storing fatigue data depending on the frequency and continuous period of each kind of motions; and fatigue calculation means for calculating a fatigue of the virtual subject on the basis of a motion measured by said motion measuring means, and fatigue data stored in said fatigue data storing means.

According to still a further aspect of the present invention there is provided a system of evaluating a workspace wherein various objects are arranged, by causing a predetermined virtual subject to conduct a motion in the workspace, said workspace being virtually produced, said system comprising: condition storing means for storing workspace data which include a shape of at least one object constituting the workspace, an arrangement of said object, and a shape of the workspace where said object is disposed; and virtual subject data which include an arrangement and a shape of a virtual subject conducting a work in the workspace, and a knowledge for generating a motion; display means for displaying the workspace and the virtual subject; designation means for designating one object which is to be operated by the virtual subject in the workspace, or plural objects which are to be operated and operation sequence of said plural objects; virtual subject visual field display means for displaying a visual field from an individual viewpoint of one or plural virtual subjects existing in said condition means;

and visual field designation means for designating a visual field of a virtual subject which is to be displayed, to said virtual subject visual field display means.

According to the invention, conditions of the operator and the workspace can adequately be given, and therefore an effect that the workspace can quantitatively be evaluated is attained.

According to the invention, motions of the operator are obtained in accordance with a sequence input through sequence input means from data of objects in the workspace and those of the operator, and the motions are sequentially displayed on display means. Consequently, it is possible to compare in superiority various alternatives with each other by counting motions calculated by motion calculation means for each of the cases where the body part sizes of the operator are changed, where the arrangement of objects in the workspace is changed, and where the task sequence is changed.

According to the invention, interference judging means judges whether or not an object in the workspace is within the visual field of the operator, an object obstructing the gaze point is judged, interference counting means for counting the degree of obstruction of an object with respect to a task sequence and body part sizes is provided, and the result is displayed. Consequently, it is possible to easily compare at a glance the degrees of deteriorating the workspace by objects for each of the cases where the body part sizes of the operator are changed, where the arrangement of objects in the workspace is changed, and where the task sequence is changed.

According to the invention, in addition to data of objects in the workspace and virtual subjects, the reachable areas of parts such as hands and feet of the virtual subjects are provided, and the reachable area are displayed for each workspace. Consequently, it is easily confirmed whether or not the hands or feet of a virtual subject can reach the operation target. This confirmation can be easily done even when where the arrangement of devices in the workspace is changed, or when the height of the virtual subject is changed (for example, the virtual subject is changed to a child or to a person using a wheelchair).

According to the invention, fatigue of a virtual subject is calculated on the basis of fatigue data depending on the frequency and continuous period of each kind of motions and also on a motion measured by motion measuring means, the motion generation is conducted so as to reflect the fatigue, and the result is displayed on display means. Consequently, differences in fatigue can be anticipated on the basis of differences in motions due to a positional change of a device in the workspace, thereby allowing various fatigue problems such as asthenopia and lumbago owing to the arrangement of devices or the use of the devices, to be previously considered.

According to the invention, the visual field is displayed in the viewpoint of each virtual subject, and the viewpoint is switched to that of each of plural virtual subjects in the workspace so that the arrangement of devices, etc. is confirmed. When a plurality of virtual subjects are in the same workspace, consequently, it is possible to grasp differences in viewpoint (or sight) in accordance with their physical conditions. This allows discomfort which a short person may undergo to be checked in advance, whereby possible problems of the workspace to evaluated can easily be eliminated in advance.

BRIEF DESCRIPTION OF THE DRAWINGS

FIG. 2 is a view showing an example of a storage format of a three-dimensional object stored in a workspace storage section of the first embodiment;

FIG. 3 is a view showing an example of a storage format of a task sequence stored in a task sequence storage section of the first embodiment;

FIG. 4 is a view showing an example of a storage format of a task sequence stored in a range-of-movement storage section of the first embodiment;

FIG. 22 is a view showing an example of a storage of a three-dimensional object stored in a workspace storage section of the fourth embodiment;

FIG. 23 is a view showing an example of a storage of a reachable area stored in a reachable are storage section of the fourth embodiment;

FIGS. 25(a)–25(c) are diagrams showing an example of a display of the reachable area in an output section of the fourth embodiment;

FIG. 30 is a view showing an example of a storage of an operation area in the fifth embodiment;

FIG. 31 is a view showing an example of a storage of a three-dimensional object and an operation area in the fifth embodiment;

FIG. 33 is a view showing an example of a storage in a task instruction storage section of the sixth embodiment;

FIG. 35 is a view showing an example of a storage in a fatigue data storage section of the sixth embodiment;

FIG. 36 is a view showing an example of a measurement result in a motion measuring section of the sixth embodiment;

FIG. 37 is a flowchart illustrating the process sequence of a fatigue calculating section of the sixth embodiment;

FIG. 38 is a flowchart illustrating the process sequence of a representing fatigue section of the sixth embodiment;

DETAILED DESCRIPTION OF THE PREFERRED EMBODIMENTS

Hereinafter, embodiments of the invention will be described with reference to the drawings.

I. First Embodiment

First, a workspace evaluation system according to a first embodiment of the invention will be described.

Figure 1:
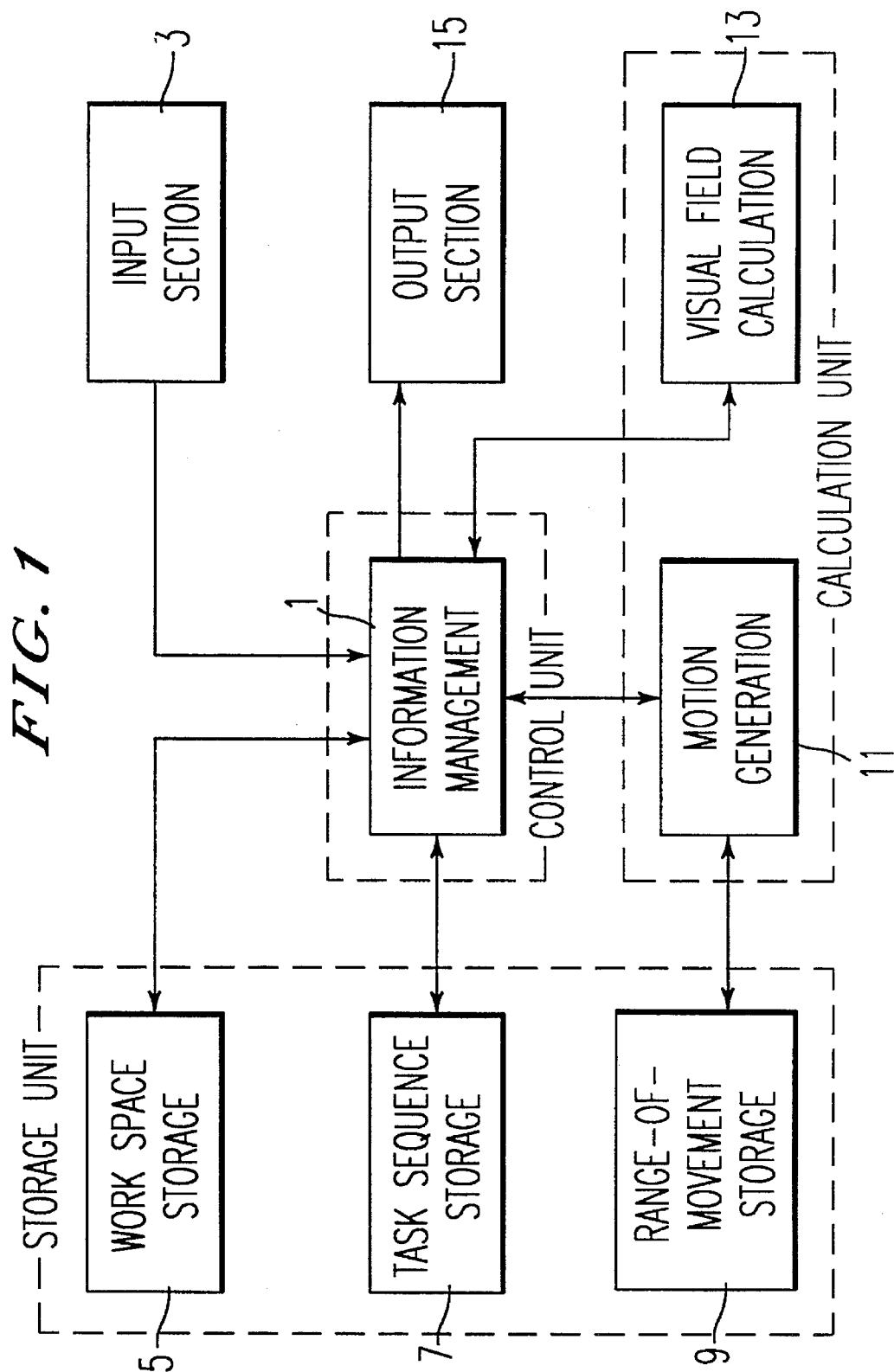
FIG. 1 is a block diagram showing the configuration of a first embodiment of the invention.

FIG. 1 is a block diagram showing the configuration of the workspace evaluation system of the embodiment.

Referring to FIG. 1, in the workspace evaluation system of the embodiment, an input section 3 is connected to an information management section 1. Conditions such as a workspace and a task sequence which are input through the input section 3 are respectively stored in a workspace storage section 5 and a task sequence storage section 7 which are connected to the information management section 1. A motion generating section 11 is connected to the information management section 1. A range-of-movement storage section 9 is connected to the motion generating section 11. Furthermore, a visual field calculating section 13 and an output section 15 are connected to the information management section 1.

Hereinafter, these components will be described together with their operation. The input section 3 is used to read a file or the like wherein three-dimensional shapes obtained by a three-dimensional CAD or the like of objects such as a supervisor control panel, a desk, a chair, and a computer monitor constituting a workspace are written in an arbitrary format (for example, dxf file format which is the standard in the technical field), to designate the position at which the readout object is to be located, and to input sequences of a task which uses a computer display and a task which is conducted in the whole of the task space. The input section 3 comprises a pointing device such as a keyboard or a mouse, an external storage medium reading device consisting of a floppy disk drive or the like, and a connector through which an external network such as Ethernet cable is connected.

The workspace storage section 5 stores three-dimensional shapes and their positions which are input through the input section 3, the position of the operator, and sizes of body parts of the operator such as the height and the sitting height, in a format such as that shown in FIG. 2. As shown in FIG. 3, the task sequence storage section 7 stores task sequences which are input through the input section 3, and the object to which the operator gazes while conducting a task, in the specific format. The range-of-movement storage section 9 stores the limiting angle of vertical and lateral neck rotation which is done when a person acts, and the limiting distance of movement in the vertical and horizontal directions which is caused by movement of the person's waist when the operator rises or sits, in a format such as that shown in FIG. 4.

Figure 6A:
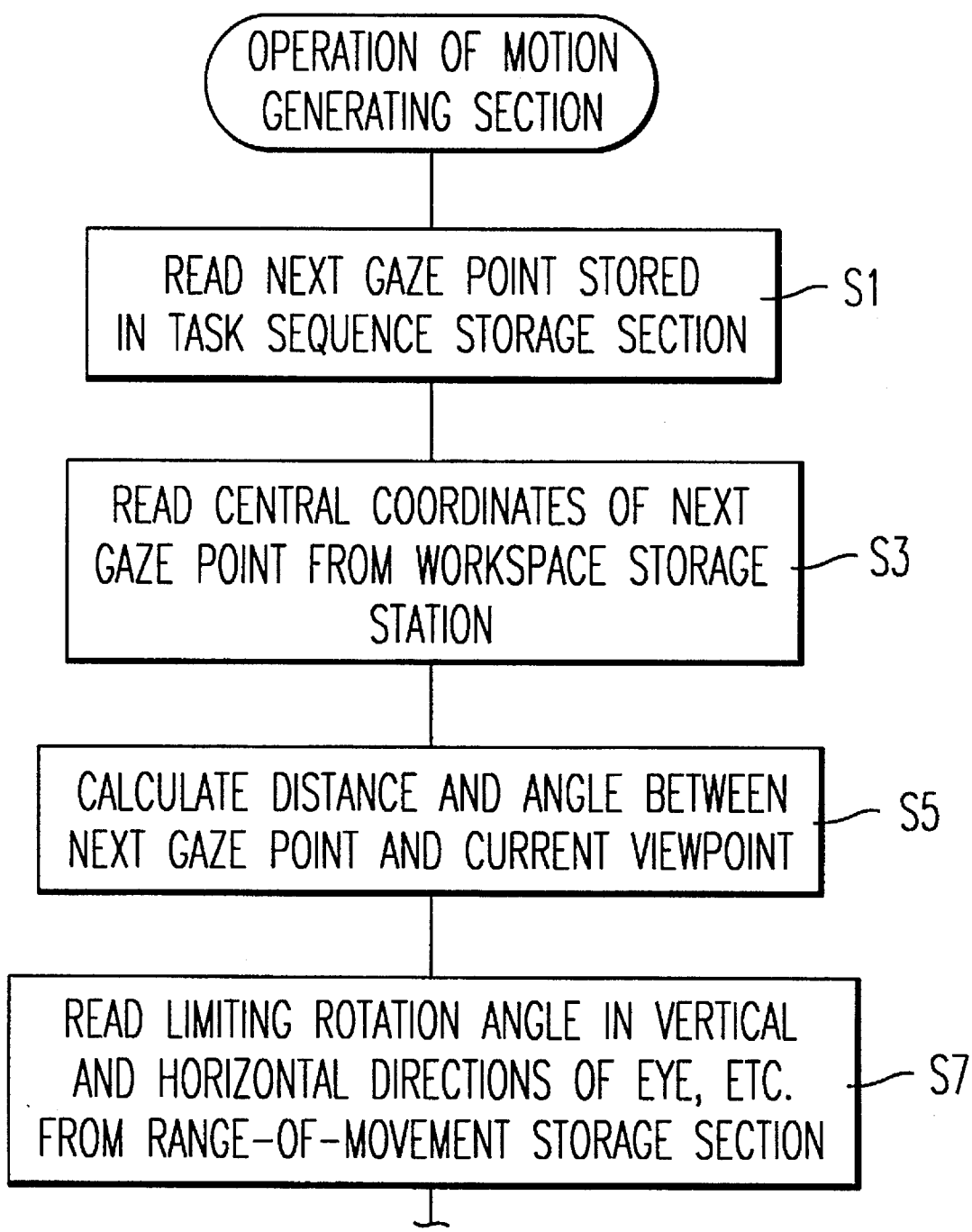
FIG. 6 is a flowchart illustrating the process sequence in a motion generation section of the first embodiment.
Figure 6B:
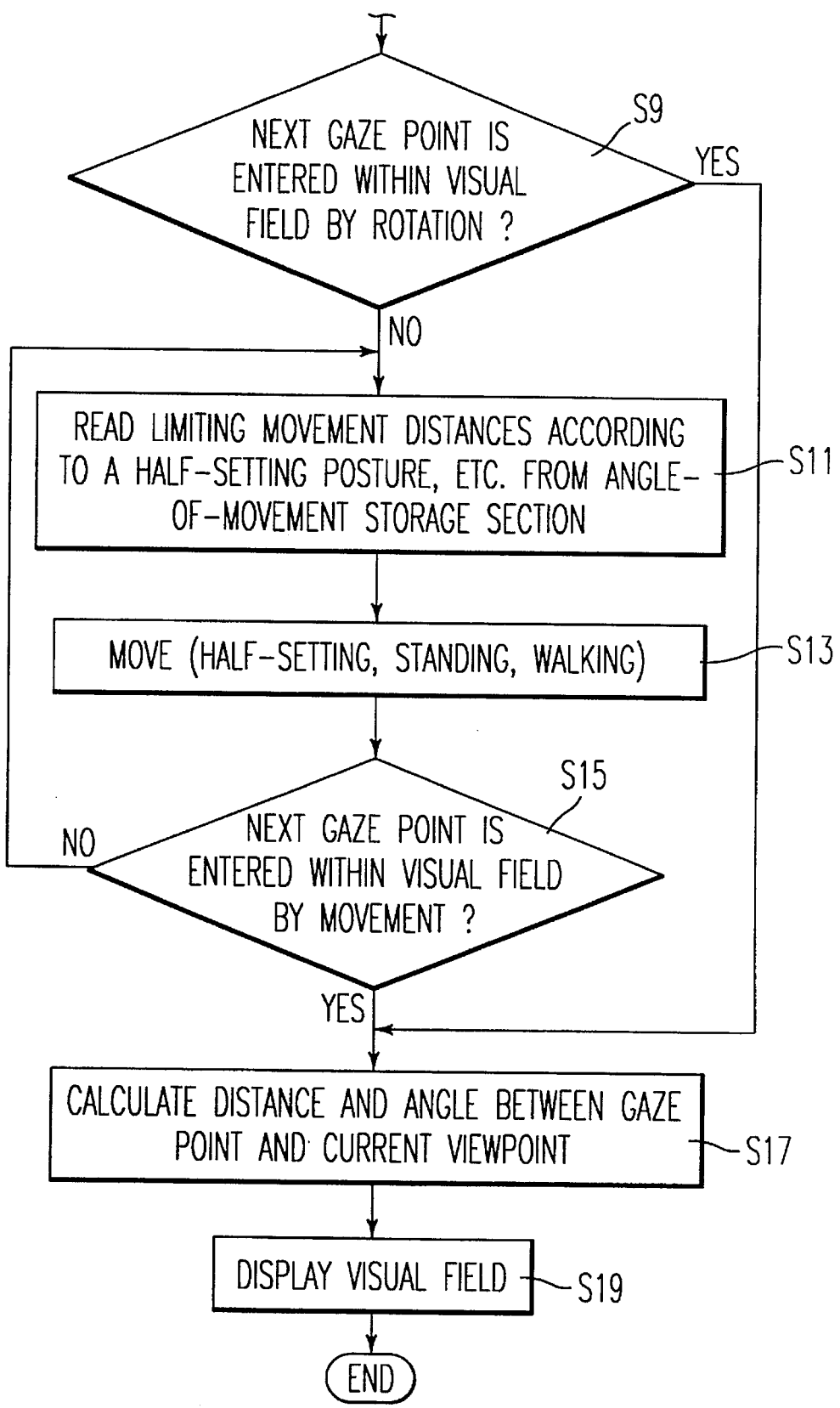
Figure 7:
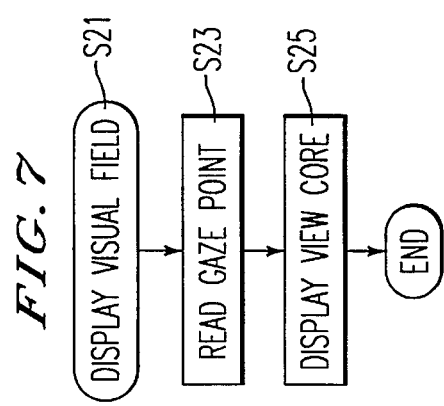
FIG. 7 is a flowchart illustrating the process sequence in a visual field calculating section of the first embodiment.

In accordance with the sequence stored in the task sequence storage section 7 and a process flow such as that shown in FIG. 6, the motion generating section 11 calculates the motion sequence of an operator attained when the operator conducts a series of works, on the basis of the position and shape of a three-dimensional object which are stored in the workspace storage section 5, the initial position of the operator and sizes of body parts such as the height which are input through the input section 3, and the limiting rotation angles and the limiting movement distances of a person which are stored in the range-of-movement storage section 9. The visual field calculating section 13 calculates the change of the visual field in accordance with the motion calculated by the motion generating section 11 along the process flow such as that shown in FIG. 7. FIGS. 6 and 7 will be described in detail later.

The output section 15 consists of a CRT (cathode ray tube) display or the like for displaying the workspace stored in the workspace storage section 5 and the change of the visual field of the operator calculated by the visual field calculating section 13.

The information management section 1 controls the data flow and the process between the input section 3, the workspace storage section 5, the task sequence storage section 7, the motion generating section 11, the range-of-movement storage section 9, the output section 15, and the visual field calculating section 13.

FIG. 2 shows an example of storage of object data in the workspace storage section 5. In a table of the workspace storage section 5, stored are the names of the objects ("monitor A," "input panel," etc.), the central coordinates which function as the gazing center during the operation of the respective objects, six vertex coordinates of a rectangular parallelepiped (hereinafter, referred to as "boundary box") which is circumscribed about each three-dimensional shape, and pointers indicating locations where actual three-dimensional shape data are stored. In some cases, three-dimensional shape data have the format (for example, dxf format) obtained when they are input through the input section 3. In most cases, however, the format of three-dimensional shape data is converted into another format for which the rewriting process can be rapidly conducted when they are to be displayed on the output section 15. The vertex coordinates of a boundary box may be input through the input section 3. In most cases, however, a rectangular parallelepiped which is circumscribed about a three-dimensional shape input through the input section 3 is calculated by the information management section 1, and the calculated vertex coordinates of the rectangular parallelepiped are stored as shown in FIG. 2.

FIG. 3 shows an example of a task sequence stored in the task sequence storage section 7. For each task step, the name of an object which is to be gazed at (corresponding to the name of the object stored in the workspace storage section 5) is stored. As shown in an example of FIG. 9, an actual task sequence is input by operating the pointing device such as the mouse of the input section 3 to sequentially designate target objects which are to be gazed at in the workspace displayed on the output section 15.

The information management section 1 retrieves the object which is nearest to the position designated through the input section 3, from the objects stored in the workspace storage section 5 (for example, the section 1 searches the boundary box which includes the three-dimensional coordinates designated through the input section 3). The name of the object is read out from the names in the format of FIG. 2, and written into the table of FIG. 3. This process is sequentially repeated so that the names of the objects to be gazed in the steps are input as shown in FIG. 3.

Alternatively, the names of the objects may be input by reading a file stored in the format of FIG. 3, and directly editing the file using the keyboard of the input section 3. In the example of FIG. 3, the names of the objects to be gazed at are stored in each step. The format of the storage of names is not restricted to this.

FIG. 4 shows an example of a storage format of the range-of-movement storage section 9. The range-of-movement storage section 9 stores the maximum degree of rotation or movement in the x, y, and z axes for each body part of a person (for example, joints such the neck, waist, and shoulders) which functions as a pivot during when the person conducts an operation, in accordance with differences between individuals, for example, differences between the sexes, ages, and athletic experiences.

Figure 5A:
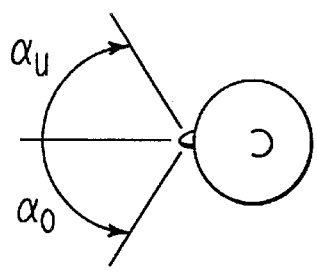
FIGS. 5(a)–5(c) are diagrams illustrating motion storage variables used in the first embodiment.
Figure 5B:
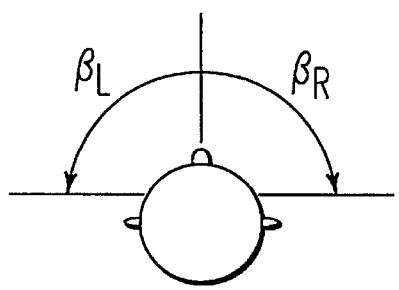
Figure 5C:
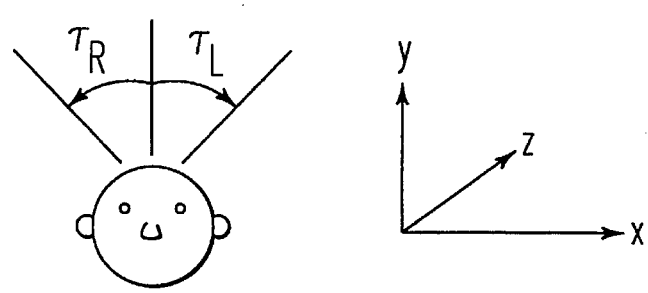

With respect to the neck (model), for example, as shown in FIG. 5, the rotation in the upward and downward directions (about the x axis) and that in the rightward and leftward directions (about the y and z axes) are separately stored. Since the neck cannot move in the directions of the x, y, and z axes, the degrees of movement in these directions are zero. Data for the waist are stored in the same manner. As these data, values determined with reference to measured values of body parts which are shown by, for example, Morgan, C. T., Cook, J. S., Hacpanis, A., and Jund, M. W., "Handbook of Human Factors-Human Engineering Guide to Equipment Design" (published by CORONA PUBLISHING CO., LTD.) are stored.

In the embodiment, it is provisionally supposed that the rotation about the x axis in the upward direction (bending behind side for head) is 20 deg., that in the downward direction (bending front side for head) is 45 deg., the rotation about the y axis in the rightward and leftward directions (bending for head) is 41 deg., and the rotation about the z axis in the rightward and leftward directions (rotating for head) is 50 deg.

With respect to the eyes, angles at which information can be instantaneously extracted only by moving eyeballs and without moving the neck, etc. are stored. Actual values are determined in accordance with data obtained by Hatada ("Human Engineering," Vol. 27, No. 2 ('86)) (see FIG. 8). Namely, the rotation about the x axis in the upward direction is 8 deg., that in the downward direction is 12 deg., and the rotation about the y axis in the rightward and leftward directions is 15 deg. The distance which an operator can see without accompanying any movement depends on the visual acuity of the operator. In the example of FIG. 4, Σ is stored as the default (a value used when none is explicitly input) of the distance.

The operation of the motion generating section 11 will be described in detail along the process flow of FIG. 6. The position of the operator which is input through the input section 3 is $(X_1, Y_1, Z_1)$, the height is L cm, and the height of a chair is M cm. When a person of the height of L cm works while sitting, the sitting height is k% of the height, and the height of the eye with respect to the sitting posture is e% (according to the data book of Morgan, k is about 52 and e is about 87). The parallax of the eyes is set to be d cm (d is about 8). Since the height of the chair is M cm, the y coordinate of the eyes is obtained by the following expression:

$$Y_e = Y_1 + M + keL/10000$$

The x coordinates of the right and left eyes are obtained by the following expression (when assumed that the line between the eyes elongates in parallel with the x axis):

$$X_e = X_1 \pm (d/2)$$

The z coordinate is $$Z_e = Z_1$$

Referring to FIG. 6, the motion generating section 11 reads out in step S1 the next gaze point from the task sequence storage section 7. In the example of FIG. 3, a first gaze point is monitor A. The central coordinates of monitor A are read out from the workspace storage section 5 (step S3). The distance and angle between the next gaze point and the position of the current viewpoint are calculated in step S5.

Figure 20A:
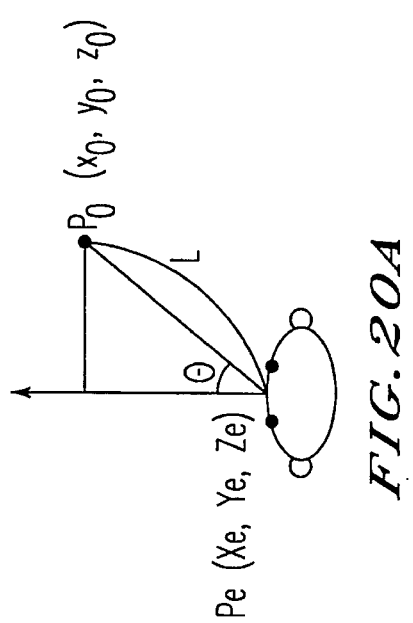
FIGS. 20(a)–20(b) are diagrams illustrating a visual field judgement.
Figure 20B:
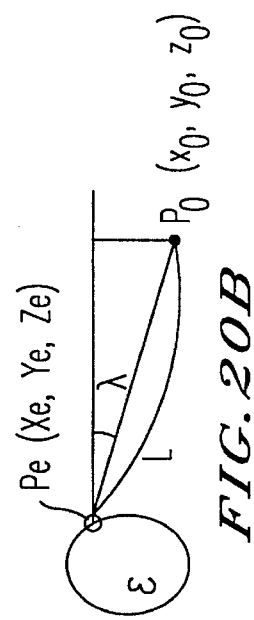

In the example of FIG. 2, as seen form FIG. 20, the distance L is obtained by $$L = \sqrt{(x_0 - X_e)^2 + (y_0 - Y_e)^2 + (z_0 - Z_e)^2}$$

the angle λ about the x axis is obtained by $$\sin \lambda = (x_0 - X_e)/L,$$

and the angle θ about the y axis is obtained by $$\sin \theta = (y_0 - Y_e)/L$$

Then, the process proceeds to step S7 to read out the limiting rotation angles in the vertical and horizontal directions of parts such as the eyes, and the face of a person, from the range-of-movement storage section 9.

In step S9, θ and λ are checked to judge whether or not they are respectively smaller than the values stored in the range-of-movement storage section 9, i.e., the limiting angles of the eyes shown in FIG. 4. If they are smaller than the values, the gaze point is within the visual field, and therefore the operation target can be seen only by moving the eyes and without conducting an operation such as rotation or movement. If they are not smaller than the values, the gaze point is not within the visual field. Therefore, it is judged whether or not the gaze point can be entered within the visual field by rotating the part subsequent to the eyes (in the example of FIG. 4, the neck).

If the gaze point can be entered within the visual field, the part is rotated. If the gaze point cannot be entered within the visual field, the limiting movement distances according to a half-sitting posture, etc. are read out in step S11 from the range-of-movement storage section, and the part is moved (step S13). For example, the movement operations are arranged in the sequence of a half-sitting posture, standing, and walking. Since the limiting distance of the neck is zero, the judgement is further conducted to confirm whether or not the gaze point can be entered within the visual field by rotating the part subsequent to the neck (in the example of FIG. 4, the waist) (steps S11, S13, and S15). In this way, the judgement is sequentially conducted on the parts listed in FIG. 4 until the gaze point can be entered within the visual field. If the gaze point cannot be entered within the visual field while standing on the spot, the operator is then caused to walk. The walking operation is carried out by previously determining the moving path in the workspace, or calculating the moving path in interference judgement which will be described later, so that the operator does not collide with the objects in the workspace.

Since the viewpoint of the operator has been changed as a result of the operation, the viewpoint is calculated again in step S17. It is a matter of course that the judgement is thereafter conducted to confirm whether or not the recalculated gaze point is within the visual field.

In step S19, the output section 15 is instructed through the information management section 1 to display the visual field.

The visual field calculating section 13 conducts the process of displaying the visual field in the process flow such as that shown in FIG. 7. At first, the coordinates of the viewpoint are read out in step S21. Then, the gaze point (in this case, $(x_0, y_0, z_0)$) is read out in step S23, and a view cone in which the origin is equal to the coordinates of the viewpoint is displayed in step S25. The limiting angle of the view cone corresponds to that of the eyes stored in the range-of-movement storage section 9 (see FIG. 8).

Figure 9:
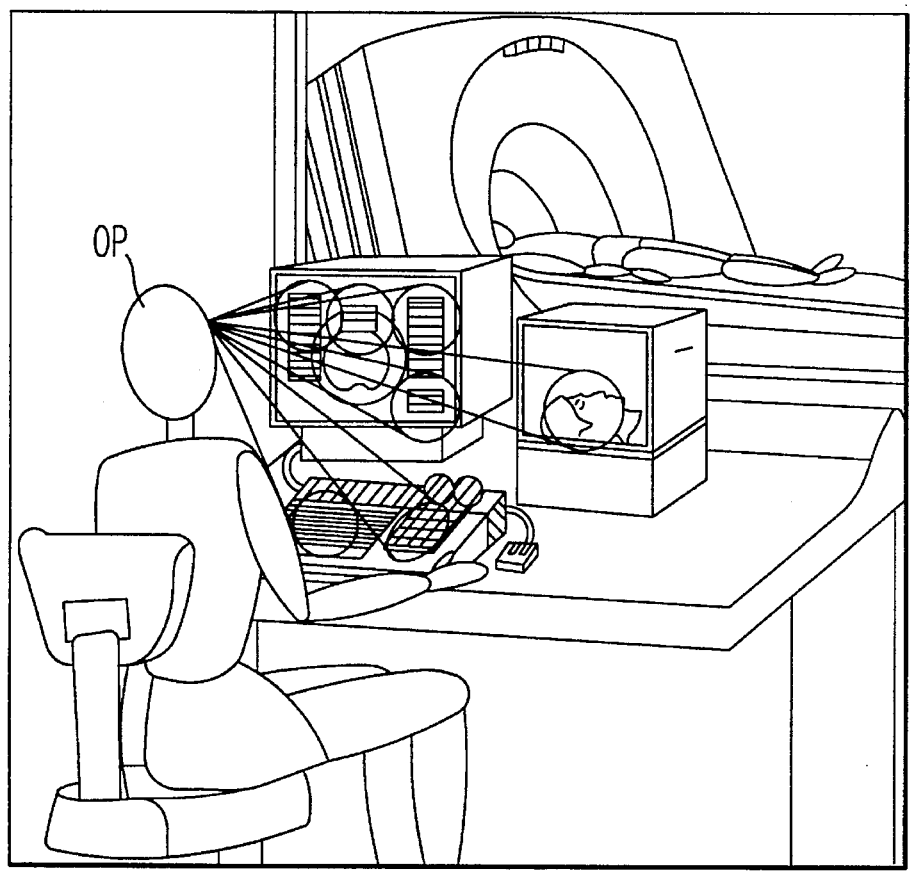
FIG. 9 is a view showing an example of a display in the first embodiment.

When the view cone is displayed on the output section 15 at the same time with the display of the workspace, the resulting display becomes as, for example, that shown in FIG. 9. FIG. 9 shows an example in which all of the visual fields of the operator obtained until a certain work is completed are displayed.

Figure 8:
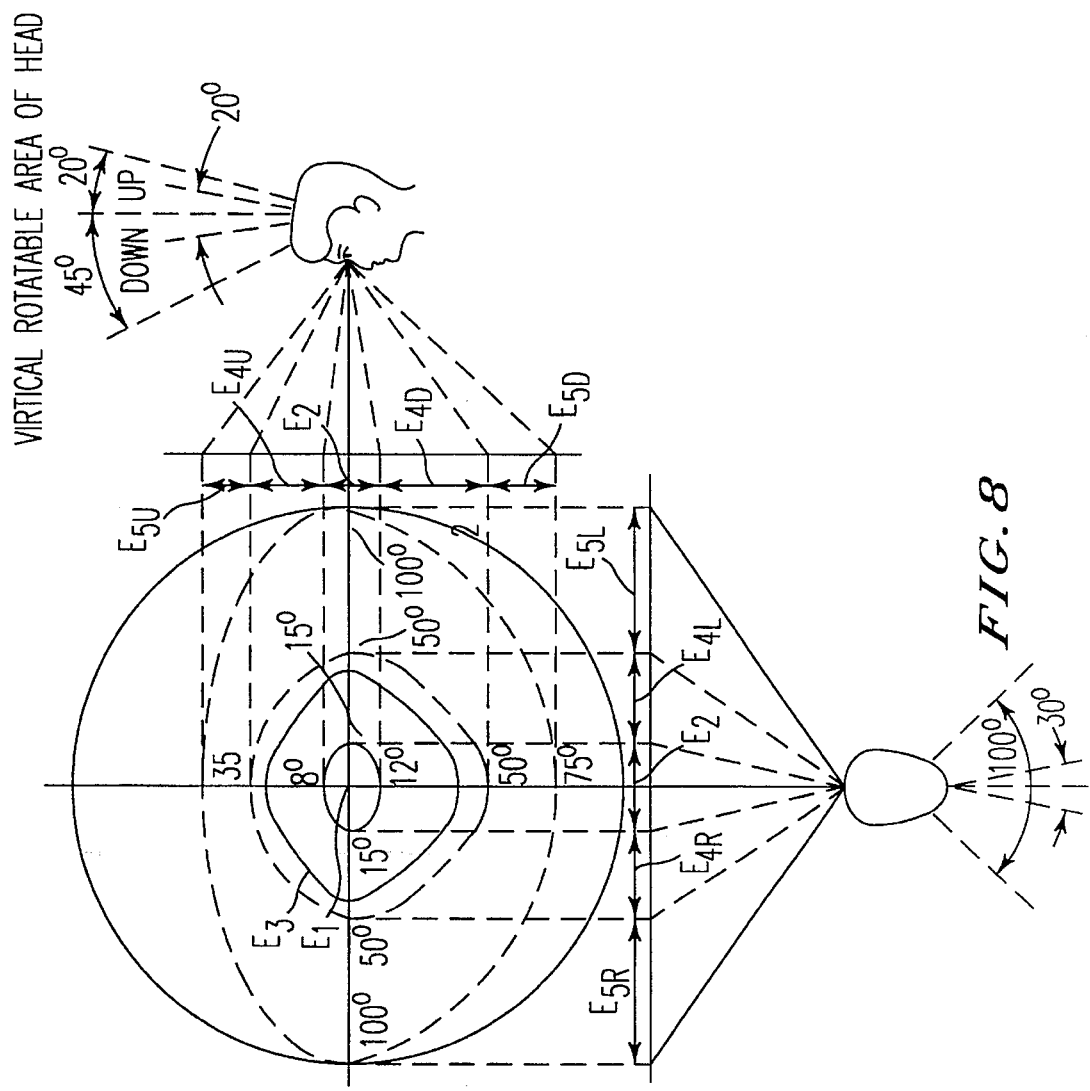
FIG. 8 is a diagram illustrating visual field data used in the visual field calculating section of the first embodiment.

Each view cone of FIG. 9 (a cone elongating from the viewpoint of the operator toward an object is referred as "a view cone" in the specification) is formed so as to have angles (about 15 deg. in the rightward and leftward directions, about 12 deg. in the downward direction, and about 8 deg. in the upward direction) of the effective visual field in which a person such as that shown in FIG. 8 can instantaneously extract specific information from background information without moving the head. In the example of FIG. 9, the effective visual field of about 15 deg. in the rightward and leftward directions is reproduced. The effective visual field in the upward and downward directions is narrower than that in the rightward and leftward directions. Considering this fact, the more correct effective visual field of an operator may be displayed by using a view cone which is flattened in the upward and downward directions. A view cone is produced in such a manner that the above-mentioned gaze point and the eyes (the center of the eyes) are set as the height and the visual field portion about the gaze point is set as the base.

However, the actual eyes of a person have a guided visual field (about 50 deg. in the rightward and leftward directions, about 45 deg. in the downward direction, and about 40 deg. in the upward direction) in which information cannot be identified but its existence can be judged. The guided visual field is a range where the presence of a large screen or the like is given. When abrupt movement is done, furthermore, the detectable supplementary visual field extends to 100 deg. or more in the rightward and leftward directions, and 85 deg. or more in the vertical directions. When the guided visual field is displayed as an unfocused image and the supplementary visual field is displayed as an achromatic image which is further out of focus, a guided visual field cone and a supplementary visual field cone may be formed in the circumference of the effective visual field cones of FIG. 9 and in different colors. The guided visual field cone enables information for conducting a display with presence to be judged whether or not the operator correctly sees the information. Furthermore, the supplementary visual field cone enables the judgement on whether or not the blinking or the like of an alarm device is within the supplementary visual field of the operator, to be conducted.

Figure 10:
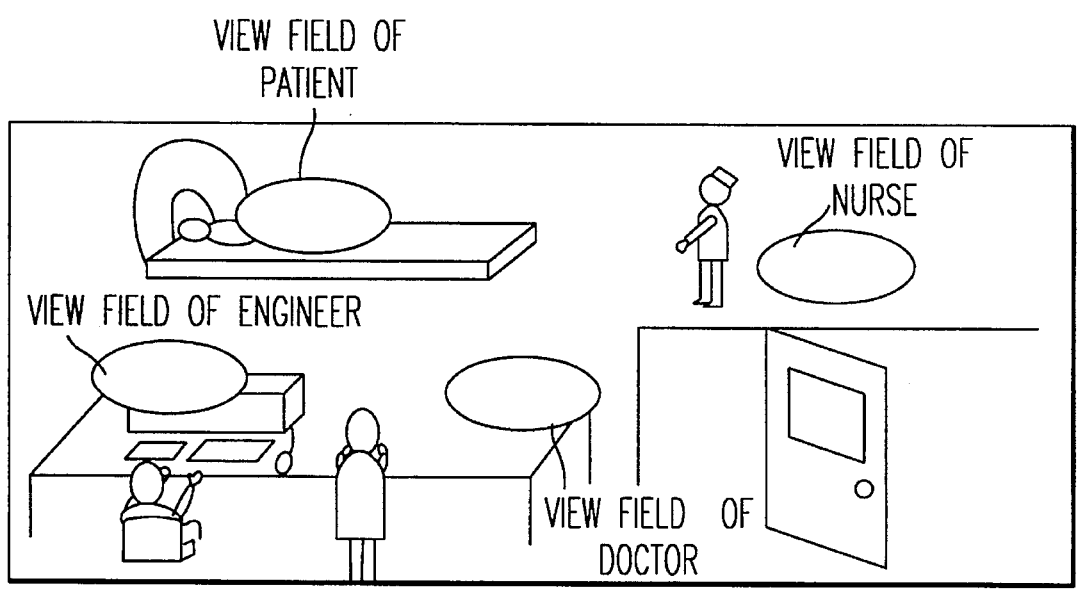
FIG. 10 is a view showing another example of a display in the first embodiment.

FIG. 10 shows an example of displays for allowing targets at which operators of different standpoints gaze at a certain point of time, to be compared with one another.

The display method is not restricted to that shown in FIGS. 9 or 10. For example, only the visual fields of two operators may be traced. Alternatively, the visual field of one operator may be traced and the visual field(s) of one or more other operators may be displayed for reference.

When the body part sizes and heights of the chair and the desk are changed to various values through the input section 3, it is possible to easily know differences in visual field due to the differences in these data.

In the embodiment, the body part sizes are designated through the input section 3. Alternatively, the body part sizes shown in, for example, the data book of Morgan (e.g., values from 5 percentile to 95 percentile) may be previously input to be stored in the workspace storage section 5, so that operations for various body part sizes are calculated in a substantially automatic manner.

In the process of FIG. 6, only judgement on whether or not the central point is within the visual field is conducted. The manner of judgement is not restricted to this. For example, the case where the whole of the screen of a monitor display must be within the visual field can be accommodated by storing vertex coordinates of the screen which is to be gazed at, in place of the central coordinates shown in FIG. 2. The case where the whole image of a patient must be within the visual field can be accommodated by conducting judgement on the vertex coordinates of the boundary boxes shown in FIG. 2. A flag indicative of the type (the target to be gazed is the center point, the face, or the whole of an object) may be stored separately, whereby each of targets can be designated to be gazed at or not to be gazed at.

The display method of the output section 15 shown in FIG. 9 is not restricted to that described above. For example, a view cone may be displayed for each of targets to be gazed (monitor A, a patient, . . . ), or a part of a view cone for a portion which becomes visible owing to a change of the height of the chair or the desk may be displayed.

Figure 13:
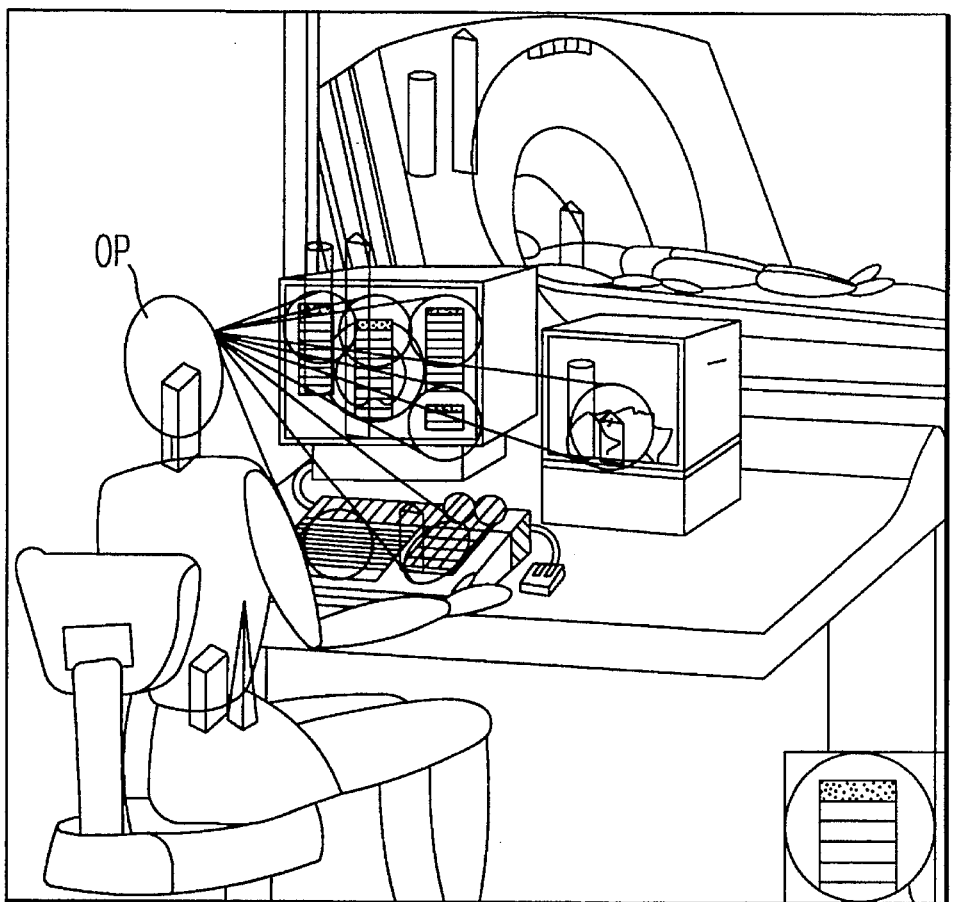
FIG. 13 is a view showing an example of a display in the second embodiment.

As shown in the right and lower portion of FIG. 13, the visual field (area) of an object to which the operator is to gaze may be separately displayed. In this case, the visual field changes in accordance with the motion of the operator.

II. Second Embodiment

Next, a workspace evaluation system according to a second embodiment of the invention will be described.

Figure 11:
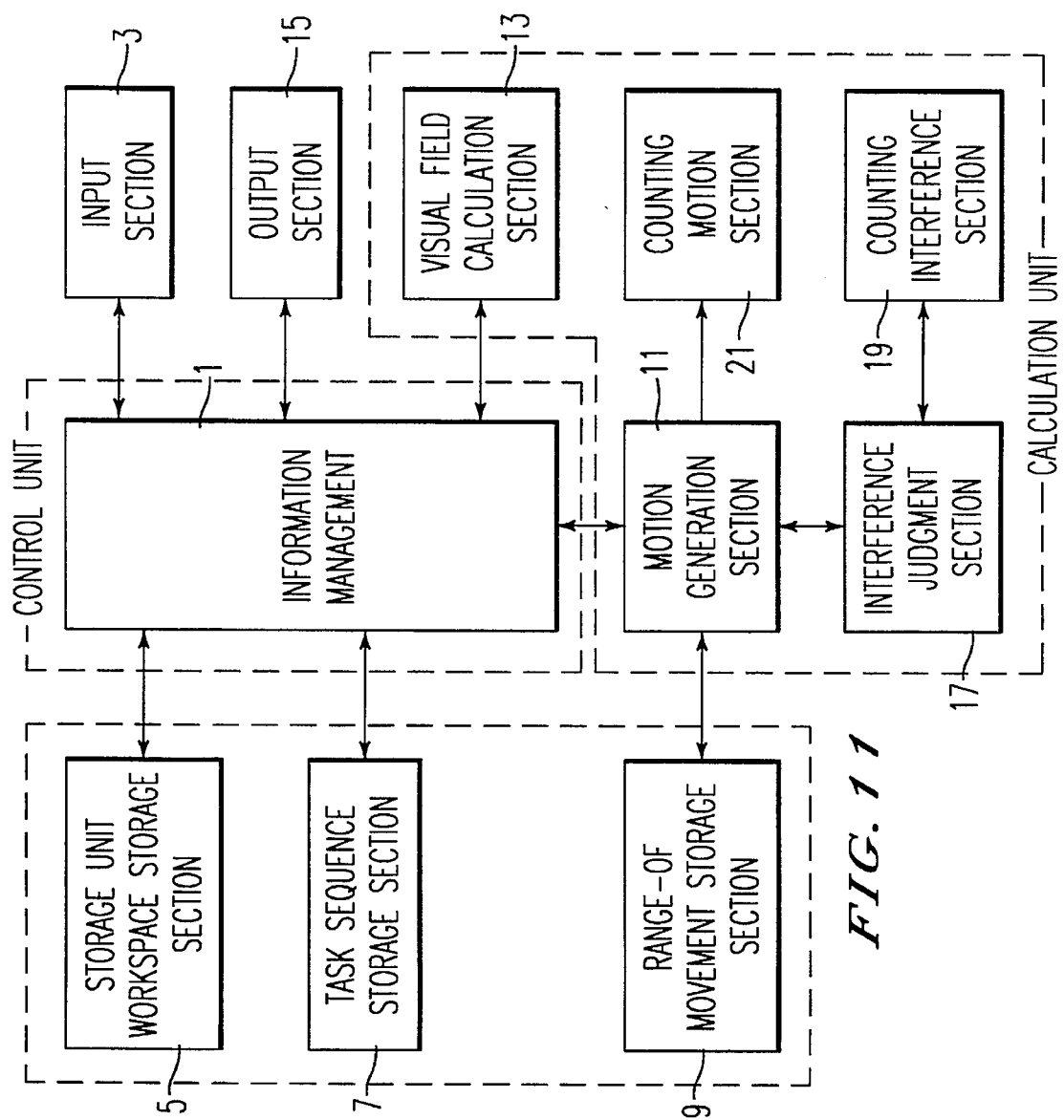
FIG. 11 is a block diagram roughly showing the configuration of a second embodiment of the invention.

FIG. 11 is a block diagram showing the configuration of the workspace evaluation system of the embodiment. In the workspace evaluation system, an input section 3 is connected to an information management section 1. Conditions of a workspace and a task sequence which are input through the input section 3 are respectively stored in a workspace storage section 5 and a task sequence storage section 7 which are connected to the information management section 1. A range-of-movement storage section 9, an interference judgement section 17, and a counting motion section 21 are connected through a motion generating section 11 to the information management section 1. A counting interference section 19 is connected to the interference judgement section 17. Furthermore, a visual field calculating section 13 and an output section 15 are connected to the information management section 1. The embodiment is basically identical in configuration with the first embodiment, and the description will be made stressing the configuration which is not included in the first embodiment.

Hereinafter, these components will be described together with their operation. The interference judgement section 17 judges whether or not an object is within the visual field to obstruct the view of the operation target. The counting interference section 19 counts the number of such interferences for each obstructing object. The counting motion section 21 counts motions calculated by the motion generating section 11.

Figure 12:
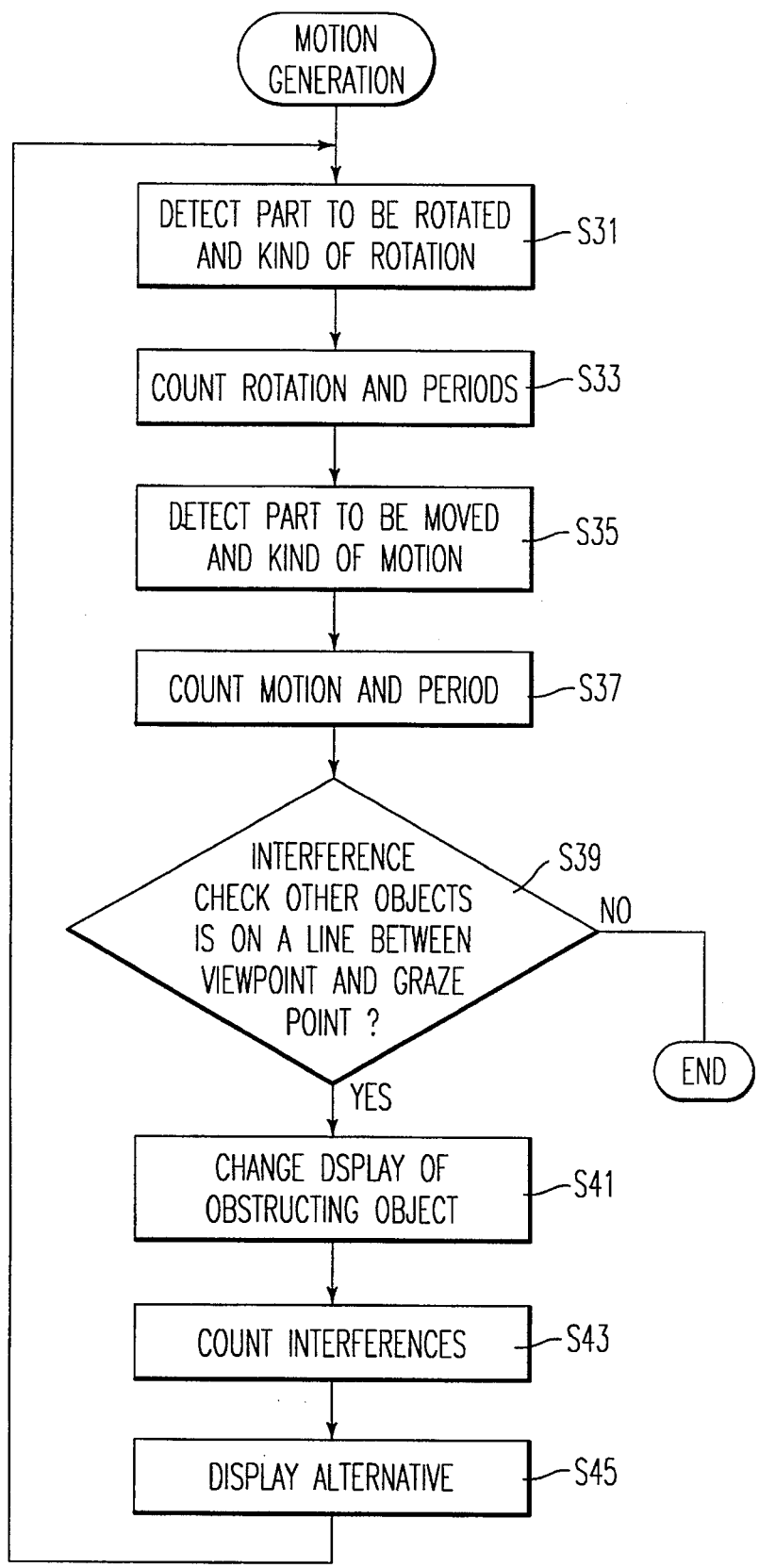
FIG. 12 is a flowchart illustrating the process sequence in a motion generation section of the second embodiment.

The process flow in the motion generating section 11 is partly modified as shown in FIG. 12. Specifically, when it is decided to conduct a rotation, the part to be rotated and the kind of the rotation are detected in step S31, and the counting motion section 21 conducts the counting operation in step S33. Similarly, with respect to movement, the part to be moved is detected in step S35, and the counting motion section 21 conducts the counting operation in step S37. When the gaze point is entered within the visual field, the interference judgement section 17 judges in step S39 whether or not any obstructing object exists in the visual field. At this time, in order to conduct the interference judgement at a high speed, interference of view cones with boundary boxes of objects which are stored in the workspace storage section 5 is judged.

If there is an interfering object, the color of the object is changed in step S41 so as to clearly indicate the obstructing object, and the number of interferences is counted in step S43 for each object by the counting interference section 19.

The counting results of the counting motion section 21 and the counting interference section 19 are superimposed on the workspace to be displayed in the form of a bar graph as shown in FIG. 13, whereby the obstructing object and the increase of the number of motions can be recognized at a glance. Since the object obstructing the operation is displayed in the manner as that of FIG. 13 so as to be grasped at a glance, it will be noted in the process of studying an alternative of the arrangement in step S45 that the position of the obstructing object is to be changed, thereby allowing an alternative to be easily produced. For example, the circular cone diagram shows the number of interferences of an object.

When an alternative in which the position and/or shape of an obstructing object is changed or the sequence is modified is displayed in the manner such as that of FIG. 13 for each of operators of different body part sizes, even a person having no technical knowledge can easily judge the propriety of the alternative.

The manner of displaying statistical values is not restricted to that of FIG. 13. For example, only counted values may be displayed so as to be separated from the workspace. When such values are superimposed on the workspace as in FIG. 13, however, it is possible to directly designate the obstructing object through the input section 3 so as to change its position, whereby the operation is greatly facilitated.

III. Third Embodiment

Next, a workspace evaluation system according to a third embodiment of the invention will be described.

Figure 14:
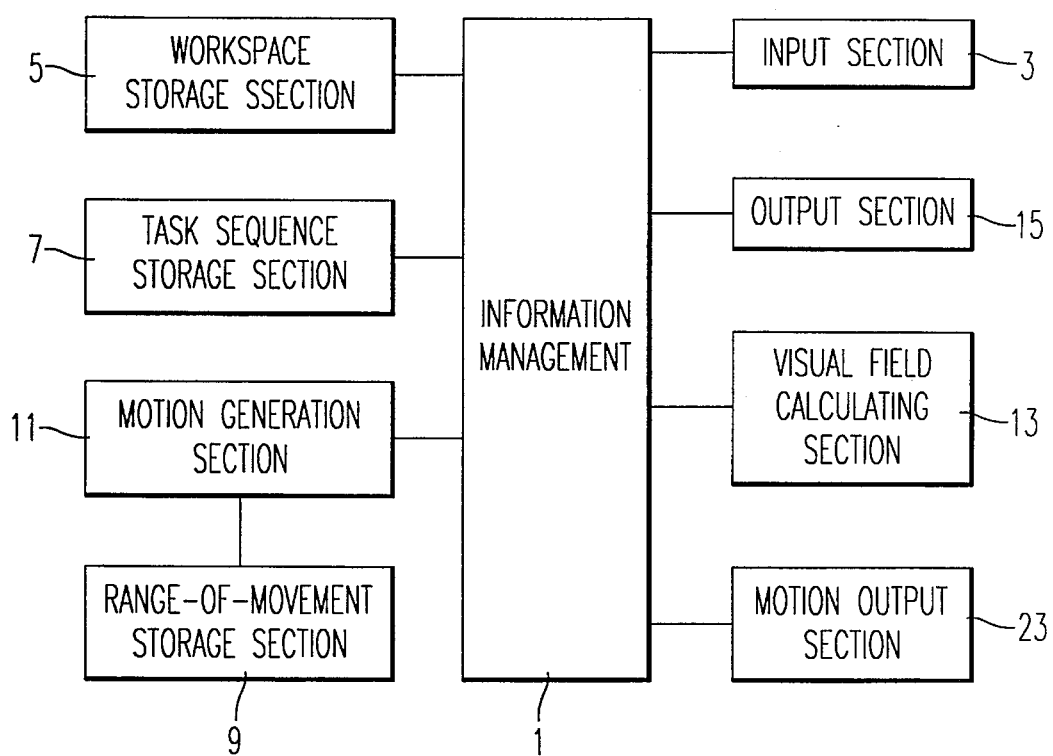
FIG. 14 is a block diagram roughly showing the configuration of a third embodiment of the invention.

FIG. 14 is a block diagram showing the configuration of the workspace evaluation system of the embodiment.

In the embodiment, a motion output section 23 for displaying the manner in which the operator dynamically moves in accordance with the motion calculated by the motion generating section 11 is added to the configuration of the first embodiment. It is a matter of course that the embodiment may be so configured that the motion output section 23 is added to the configuration of the second embodiment.

In the first embodiment, the operator does not move and only the resulting visual fields are displayed, and, also in the second embodiment, the operator does not conduct a motion and only the statistical values obtained as a result of the motion are displayed. By contrast, in the third embodiment, the operator actually conducts a motion and therefore the motion line of the operator can be traced in accordance with the task sequence. In other words, the transition from a step to the subsequent step can be analyzed. Therefore, for example, it is possible to detect an inconvenience caused in the transition from a first motion to a second motion.

The motion output section 23 receives the calculated rotation angle and moving distance of each part from the motion generating section 11 through the information management section 1. In accordance with the received values, the motion output section 23 interpolates the parts of the body and displays them as a moving image as shown in, for example, FIGS. 15 to 19.

Figure 15:
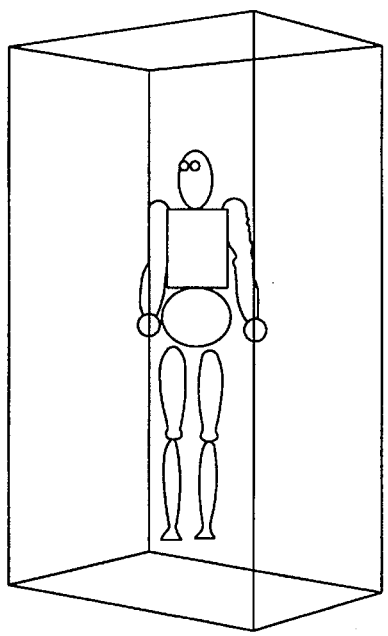
FIG. 15 is a view showing an example of a motion in the third embodiment.
Figure 16:
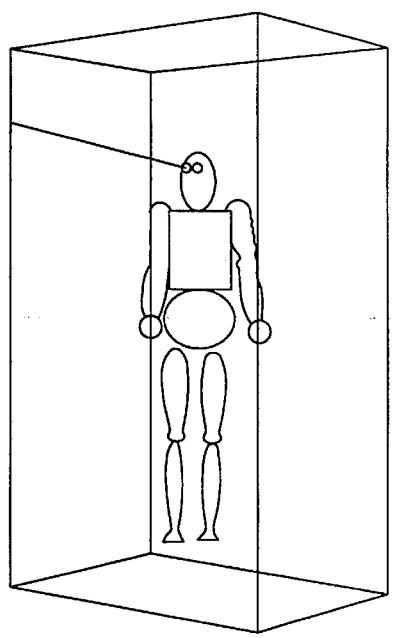
FIG. 16 is a view showing another example of a motion in the third embodiment.
Figure 19:
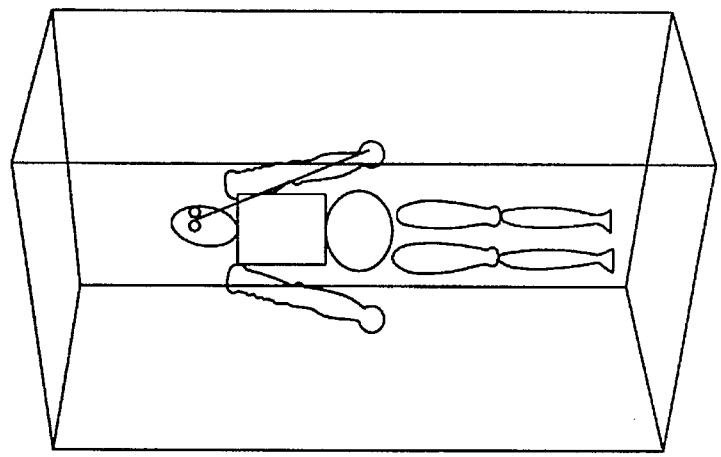
FIG. 19 is a view showing a still further example of a motion in the third embodiment.
Figure 18:
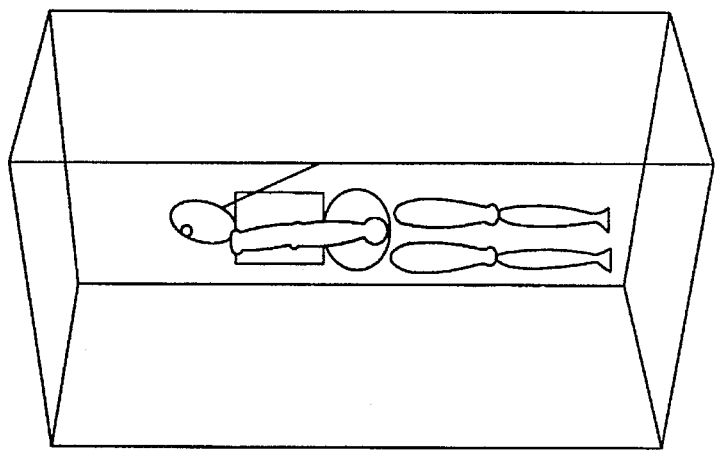
FIG. 18 is a view showing a still further example of a motion in the third embodiment.
Figure 17:
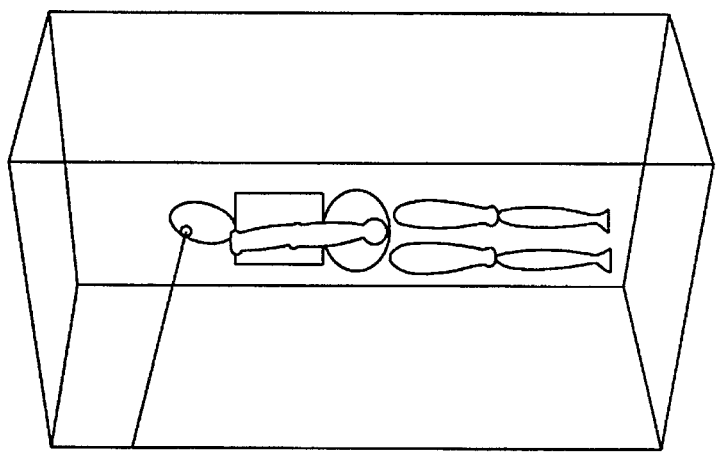
FIG. 17 is a view showing a further example of a motion in the third embodiment.

Namely, when the gaze point is set to the position shown in FIG. 16 under the predetermined state of FIG. 15, it is judged that the eye movement is not sufficient for the gaze point to be entered within the visual field, and therefore the body is twisted as shown in FIG. 17 to be directed toward the gaze point. Thereafter, the operator sees the gaze point. When the gaze point is set to a position in the opposite location as shown in FIG. 18, the gaze point cannot be entered within the visual field under the current body direction. Accordingly, the body direction is returned to the original one so that the body is directed toward the gaze point as shown in FIG. 19. Thereafter, the operator sees the gaze point. These motions are conducted in FIGS. 9 and 13, whereby the visual judgement is further facilitated.

In the embodiments described above, the objects stored in the workspace storage section 5 are those which actually exist in the workspace. The invention is not restricted to this. For example, the monitor is divided into units such as a menu and windows, and the positions are stored in the workspace storage section 5 using these units. Also in a task sequence storage section 7, the task sequence is stored using these units. According to this configuration, motions of works which are conducted facing a computer can be analyzed in more detail.

The distance from the viewpoint which is required for conducting the work may be stored in the task sequence storage section 7. In this case, the motion generating section 11 can conduct the calculation so that the operator moves by a walk or the like until the distance between the viewpoint and the gaze point becomes shorter than the stored distance.

The interference judgement section 17 may judge an object which obstructs a walk, the counting interference section 19 may conduct the counting operation, and the result may be additionally displayed in the display of FIG. 13.

Furthermore, motion targets such as the hands and the feet may be stored in the task sequence storage section 7, and limiting values of rotation and movement of joints for the hands and the feet may be stored in a range-of-movement storage section 9. In this case, in addition to the visual field, also motions of actual operation motions can be calculated and counted.

As described above, according to the above-described embodiments, the three-dimensional shape and the position of an object constituting a workspace, and the position and body part sizes such as the height of the operator are provided. According to this configuration, it is possible to compare in superiority various alternatives with each other by obtaining motions of the operator in accordance with a sequence input through sequence input means, and counting motions for each of the following cases: a case where the body part sizes of the operator are changed; a case where the arrangement of the objects in the workspace is changed; and a case where the task sequence is changed.

Furthermore, the visual field of the operator working in accordance with the task sequence is calculated, and the visual fields of operators of different standpoints (an engineer and a doctor, a patient, a supervisor and a chief supervisor, and a visitor), and the visual fields of operators of different body part sizes are compared with the whole workspace, thereby easily recognizing a disadvantage of each alternative.

When an object obstructing the view of the operator is judged and the degree of obstruction due to the object is counted for each task sequence and body part size, it is possible to identify at a glance the object which deteriorates the workspace, for each of the following cases: a case where the body part sizes of the operator are changed; a case where the arrangement of the objects in the workspace is changed; and a case where the task sequence is changed.

Moreover, since the operator can be displayed together with motion, it is possible to compare and evaluate the workspace with a more sense of reality, and it is also possible to easily detect an inconvenience of the flow of the task sequence.

As described above, according to the embodiments, conditions of the operator and the workspace can be adequately given, or modified conditions are given, thereby achieving effects such that the workspace can be quantitatively evaluated.

IV. Fourth Embodiment

Next, a workspace evaluation system according to a fourth embodiment of the invention will be described.

Figure 21:
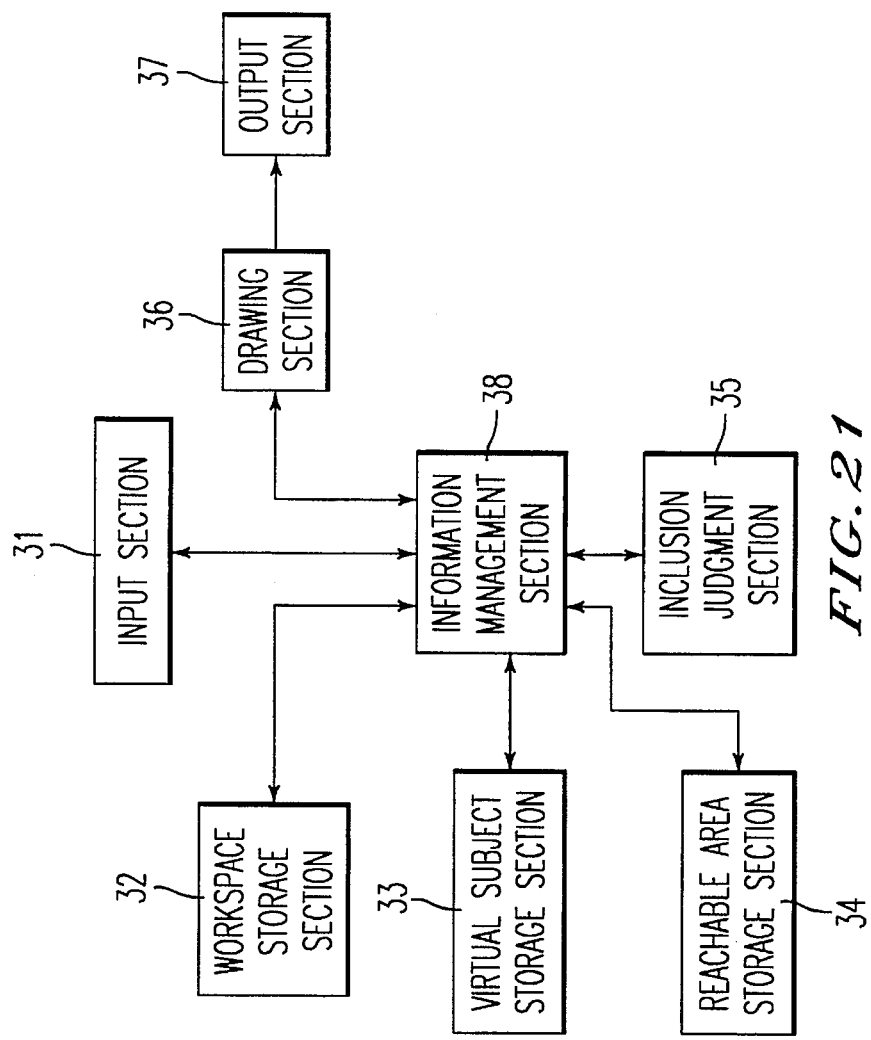
FIG. 21 is a block diagram roughly showing the configuration of a workspace evaluation system according to a fourth embodiment of the invention.

FIG. 21 is a block diagram showing the configuration of the workspace evaluation system of the embodiment. As shown in FIG. 21, the workspace evaluation system of the embodiment comprises an input section 31, a workspace storage section 32, a virtual subject storage section 33, a reachable area storage section 34, an inclusion judgement section 35, a drawing section 36, an output section 37, and an information management section 38.

The input section 31 is used to read a file or the like wherein three-dimensional shapes obtained by a three-dimensional CAD or the like and objects such as a supervisor control panel, a desk, a chair, and a computer monitor constituting a workspace are written in an arbitrary format (for example, dxf file format which is the standard in the technical field), to designate the position at which the readout object is to be located, and to input sequences of a task which uses a computer display and a task which is conducted in the whole of the task space. The input section 31 comprises a pointing device such as a keyboard or a mouse, an external storage medium reading device consisting of a floppy disk drive or the like, and a connector through which an external network such as Ethernet cable is connected.

The workspace storage section 32 stores a three-dimensional shape and its position which are input through the input section 31, in the format of, for example, FIG. 22. Similarly, the virtual subject storage section 33 stores the three-dimensional shape and the position of a virtual subject which are input through the input section 31. The reachable area storage section 34 stores the reachable area, etc. of each part of the virtual subject in the format of, for example, FIG. 23.

The inclusion judgement section 35 judges whether or not an object which is the operation target designated through the input section 31 is included in the reachable area stored in the reachable area storage section 34.

The drawing section 36 converts for each virtual subject the workspace stored in the workspace storage section 32, the virtual subject operating in the workspace and stored in the virtual subject storage section 33, and the reachable area stored in the reachable area storage section 34, into a format which can be seen.

The output section 37 consists of, for example, a CRT for displaying a drawing result of the drawing section 36.

The information management section 38 administrates the data flow and the process between the input section 31, the workspace storage section 32, the virtual subject storage section 33, the reachable area storage section 34, the inclusion judgement section 35, and the drawing section 36.

FIG. 22 shows an example of the storage format of the workspace storage section 32. Stored in the workspace storage section 32 are the central coordinates of each object, the vertex coordinates of a boundary box (a rectangular parallelepiped circumscribed about the object) which is used in the interference judgement or the like, and pointers of storage regions where three-dimensional shape data are actually stored.

Figure 24A:
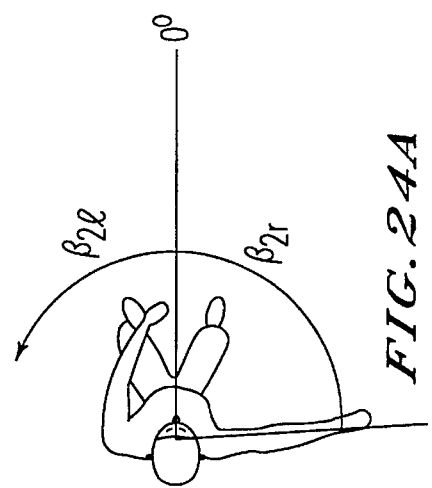
FIGS. 24(a)–24(c) are diagrams showing the relationship between a part in the reachable area and an angle in the fourth embodiment.
Figure 24B:
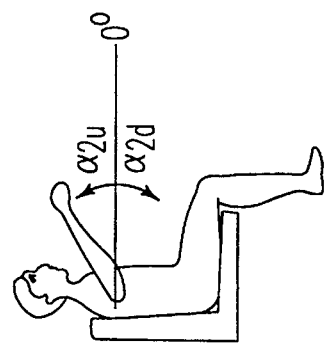
Figure 24C:
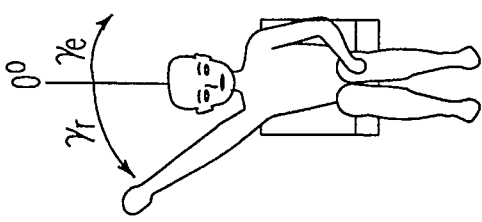

FIG. 23 shows an example of the storage format of the reachable area stored in the reachable area storage section 34. The reachable area of an arm may be directly obtained from the length of the arm as indicated by Morgan, C. T., Cool, J. S., Hacpanis, A., and Jund, M. W., "Handbook of Human Factors-Human Engineering Guide to Equipment Design" (published by CORONA PUBLISHING CO., LTD.) In this method, however, it is difficult to smoothly cope with a change of physical conditions of the virtual subject. As shown in FIG. 23, therefore, as the reachable area of an arm, used are the angles of the joints which are obtained referring to the data indicated in "Handbook of Human Factors," resulting in that the reachable area of an arm corresponds to the rotation angle about a shoulder joint. As indicated in "Handbook of Human Factors," this value varies depending on the posture (standing, sitting, etc.). For each posture, as shown in FIG. 24, angles by which the arms can be rotated about the front of the body are obtained from "Handbook of Human Factors" and then stored. For example, the reachable area of an arm forms a circular cone which has the vertex at the shoulder, the diameter equal to the length of the arm, and angles shown in FIG. 23. Similarly, the reachable area of a hand forms a circular cone which has the vertex at the wrist, the diameter equal to the length of the hand, and angles shown in FIG. 23. In an actual case, the rotatable angle varies depending on the rotation direction, and therefore the circular cone indicating the reachable area has a distorted form. Hereinafter, the term "circular cone" includes a distorted circular cone.

Figure 25B:
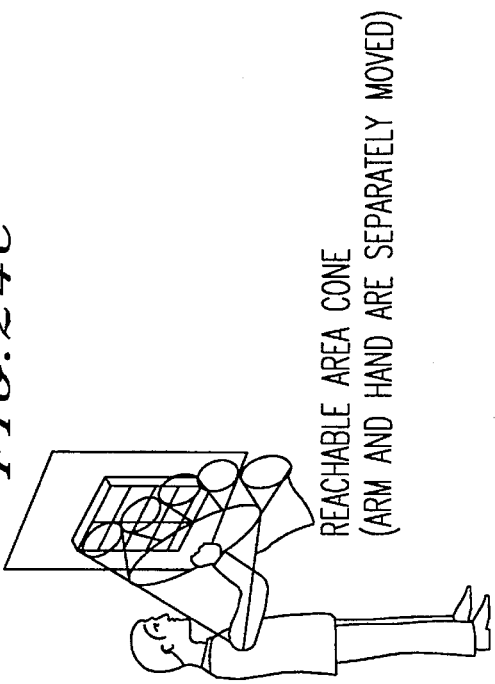
Figure 25A:
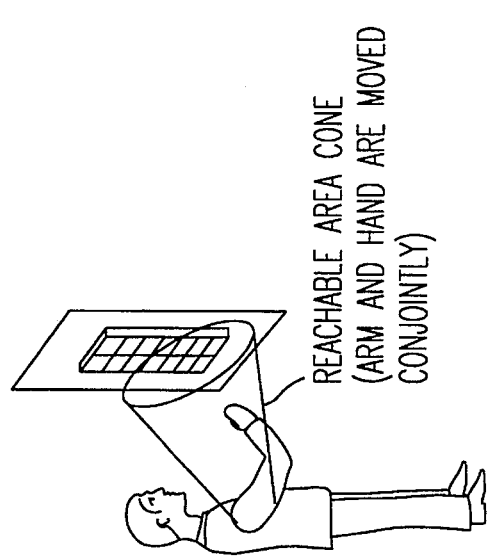

The drawing section 36 displays the reachable areas which are stored in the reachable area storage section 34 in the format of FIG. 23. For example, a function such as the alpha blending for the transparent display is used so as not affect the visualization of the positional relationship between the workspace and the virtual subject, and a translucent circular cone (when precisely displayed, a distorted circular cone) which has its vertex at a shoulder and a diameter equal to the sum of the lengths of an arm and a hand is displayed as shown in FIG. 25(*a*). Alternatively, as shown in FIG. 25(*b*), a circular cone which has a vertex at the shoulder and a diameter equal to the length of an arm, and circular cones which correspond to the hand may be separately displayed. Other various methods may be employed. For example, an arm is divided into the upper arm and the lower arm, and the display may be separated into three portions, i.e., a circular cone which has its vertex at the shoulder and a diameter equal to the length of the upper arm, a circular cone which has its vertex at the elbow and the diameter equal to the length of the lower arm, and a circular cone which has the vertex at the wrist and a diameter equal to the length of the hand. In another method, the display may be separated into two portions, i.e., two circular cones which respectively have at vertexes at the shoulder and the elbow.

Figure 26:
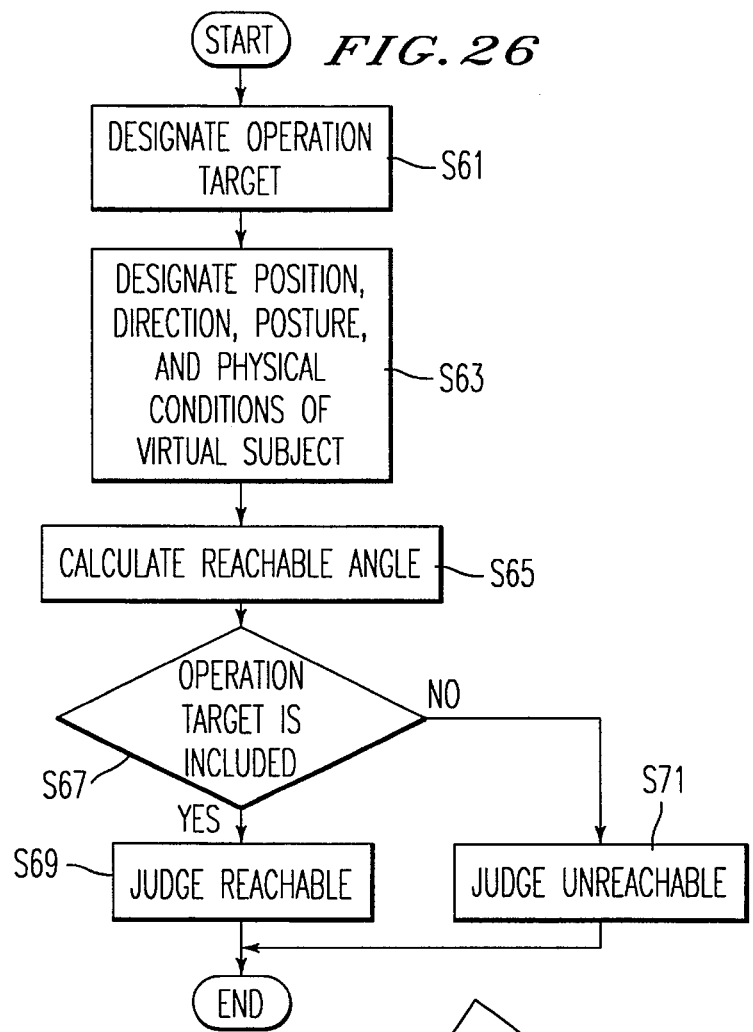
FIG. 26 is a flowchart illustrating the process sequence of the reachable area judgement.
Figure 28:
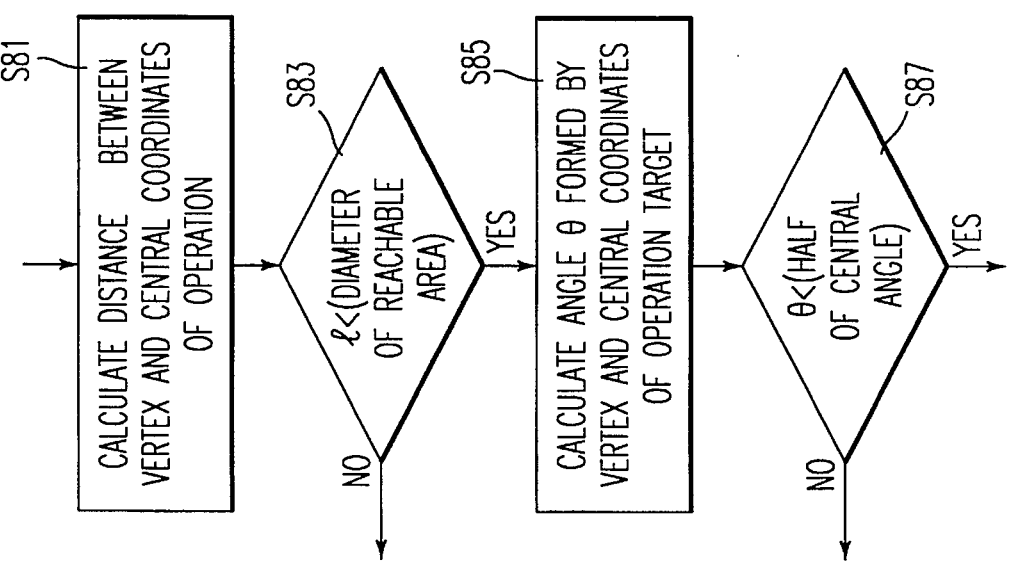
FIG. 28 is a flowchart illustrating the process sequence of an inclusion judgement section of the fourth embodiment.

Next, an example of the operation of the embodiment will be described with reference to a process flowchart of FIG. 26. A specific example of the process sequence of the inclusion judgement section which is conducted in step S26 of FIG. 26 is shown in FIG. 28.

Through the input section 31, the object to be operated is designated, and also whether or not the judgement of the reachable area of the object is conducted is designated (step S61). Various designating methods may be employed. For example, the object displayed on the output section 37 may be directly designated as shown in FIG. 25, or the object may be selected from a list of objects which exist in the current workspace. It is assumed that an input panel is designated as the operation target. The central coordinates of the input panel are known from the values stored in the workspace storage section 32 (see FIG. 22) to be $(x_2, y_2, z_2)$.

Then, the position, direction, posture, and physical conditions of the virtual subject are designated through the input section 31 (step S63). The designation of the position may be conducted by directly designating the object on the output section 37, or by directly inputting numerals of the coordinates. When the position is not explicitly designated, the current position may be further used, or the default position coordinates may be set as the initial conditions. In the embodiment, it is assumed that p=(px, py, pz) is designated as the position coordinates. Similarly, the designation of the direction of the body may be conducted directly or through the output section 37. The current direction may be further used, or the default may be set as the initial conditions. In the embodiment, it is assumed that the normal vector (unit vector) n=(nx, ny, nz) is designated as the direction.

With respect to the posture, when it is not explicitly designated, the current posture displayed on the output section 37 may be further used, or the standing posture may be set as the initial conditions. In the embodiment, it is assumed that the standing posture is designated. Similarly, when the physical conditions are not explicitly designated, the current physical conditions may be further used, or the standard physical conditions may be set as the initial conditions. In the embodiment, it is assumed that the height of L cm is designated. In the virtual subject storage section 33, data obtained on the basis of the values indicated in "Handbook of Human Factors" are stored. The data include:

ratio of the height of a shoulder to the height su (standing)

sd (sitting)

ratio of the height of an eye to the height e ratio of the length of an upper arm to the height au ratio of the length of a lower arm to the height ad ratio of the length of a hand to the height h ratio of the shoulder width to the height sw On the basis of these values, the shape data of the virtual subject are read out from the virtual subject storage section 33 to generate the virtual subject, and the information management section 38 calculates the positions of the main parts of the virtual subject such as a shoulder.

In the standing posture, since the neck which is at the same height as the shoulders is higher in the y axis direction than the center position by the height of the shoulders of L su, the position coordinates of the neck are (px, py+L su, pz). The position of the right shoulder is shifted in a direction perpendicular to the normal vector n from this position by a half of the shoulder width, and therefore can be expressed by q=(px–L hw/2 nz, py+L su+L hw/2 ny, pz+L hw/2 nx). The position of the left shoulder, etc. can be obtained in the same manner. The generated data of the virtual subject are sent to the drawing section 36 to be displayed on the output section 37.

Then, the reachable area is calculated in step S65 on the basis of the thus generated position of a shoulder joint of the virtual subject. When the virtual subject is a right-handed person, for example, the reachable area is a circular cone having the vertex at the position q of the right shoulder, the diameter equal to the length of L (au+ad+h) which is a sum of the lengths of an arm and a hand, and the central angle of αu. The calculation results are sent to the drawing section 36 to be displayed on the output section 37 as a translucent circular cone as shown in FIG. 25 (*a*).

In step S67, it is judged whether or not the target object is within the reachable area calculated in step S65. In the embodiment, for example, the judgement is conducted in the following steps.

Figure 27:
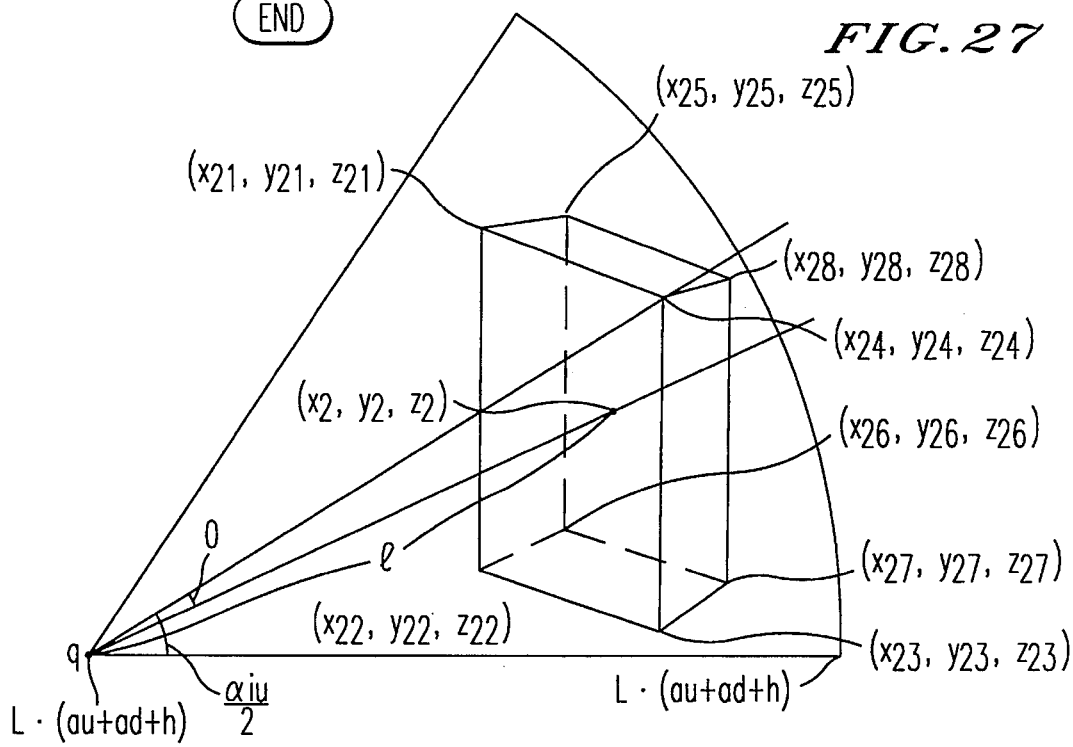
FIG. 27 is a diagram showing the relationship between the reachable area and the operation target.

As shown in FIG. 27, the distance 1 between the vertex coordinates (in this case, q) of the reachable area and the central coordinates (in this case, (x2, y2, z2)) of the operation target is calculated (step S81 of FIG. 28). It is judged whether or not the distance is shorter than the diameter (in this case, L (au+ad+h)) of the reachable area, or the central coordinates of the operation target are within the diameter of the reachable area (step S83 of FIG. 28). If no, the judgement result is indicated as no.

If yes, the angle θ formed by the vertex coordinates and the central coordinates of the operation target is calculated (step S85 of FIG. 28). Then, it is judged whether or not θ is smaller than a half of the central angle of the reachable area (in this case, αu/2) or the central coordinates of the operation target are included in the circular cone of the reachable area (step S87 of FIG. 28). If included, the judgement result is indicated as yes, and, if not included, the judgement result is indicated as no.

If the judgement result of the inclusion judgement section 35 is yes, it is judged to be reachable (step S69 of FIG. 26). In contrast, if no, it is judged to be unreachable (step S71), and instructions that the operation target which has been judged to be unreachable is to be displayed by a different color (e.g., red) so as to indicate the negative judgement is issued from the information management section 38 to the drawing section 36, thereby changing the display of the output section 37. From the color change (e.g., changed to red) of the input panel which is the operation target on the output section 37, the user can recognize at a glance the unreachable status.

The judging method of the inclusion judgement section 35 is not restricted to the process of FIG. 28. For example, an interference check may be conducted on the boundary box of the operation target and the circular cone of the reachable area so that interference is directly judged. Alternatively, a sum and exclusive OR of the boundary box and the circular cone of the reachable area may be obtained and the inclusion relationship may be judged, thereby judging whether or not the operator can reach the operation target.

Even when an object of the operation target is within the reachable area, there is a case where a hand may be caused to collide with the object by stretching the arm. This case may be handled by conducting the process of FIG. 28 also on the object stored in the workspace storage section 32. If the object is included in the reachable area, the object is displayed as an obstructive one in such a manner that the display color of the object on the output section 37 is changed or the image of the object blinks, whereby an object which may obstruct the operation can be noted.

As described above, according to the embodiment, it is possible to judge whether or not the operation target is disposed at a reachable point at an early stage of the design and by using virtual subjects of various physical conditions. Furthermore, the judgement can easily be conducted even when the arrangement of devices is changed, or when the height of the virtual subject is altered (the virtual subject is changed to a child or a person using a wheelchair.)

In addition to the display of the reachable area, the interference check is conducted to confirm whether or not the operation target is included in the reachable area. Therefore, the possibility of the operation can correctly be checked for each of operation targets.

V. Fifth Embodiment

Next, a workspace evaluation system according to a fifth embodiment of the invention will be described.

Usually, many objects such as a button and a touch screen have a specified face onto which the operation is to be conducted. Accordingly, it will be considered that the judgement on whether or not the operation target is disposed at a reachable position can be conducted more correctly by judging whether or not the operation face is included in the reachable area, in place of judging whether or not the boundary box is included in the reachable area as in the case of the fourth embodiment.

In the case where the judgement is conducted on whether or not the boundary box is included in the reachable area, the criterion of the judgement of the reachable area may be so severe that also a correct answer (reachable status) is eliminated. By contrast, when the boundary box is included in the reachable area but the operation face is located outside the circular cone of the reachable area and the direction of the operation face is opposite to that of the reachable area, there may be a case where the operation target is reachable in the viewpoint of distance but the operation face cannot be reached by the hands to be inoperable. Specifically, when the operator stands behind a monitor having a touch screen, there may arise a case where the touch screen exists within the hand-reachable area but the rear portion of the monitor obstructs the reach of the hands. In the embodiment, therefore, an operation area storage section 39 which stores the operation face of each object as the operation area is added to the configuration of the fourth embodiment, thereby solving the above-mentioned problem.

Figure 29:
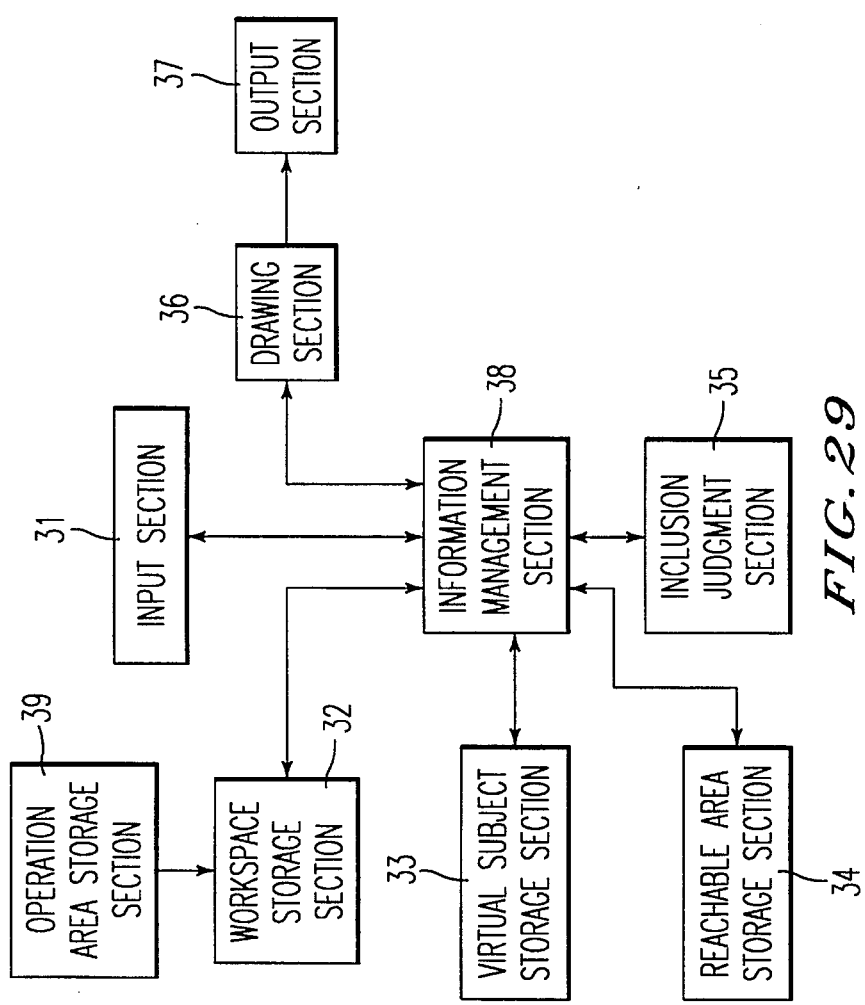
FIG. 29 is a block diagram roughly showing the configuration of a workspace evaluation system according to a fifth embodiment of the invention.

FIG. 29 roughly shows the configuration of the workspace evaluation system of the embodiment. The added operation area storage section 39 stores the operation face of each object in the format of, for example, FIG. 30.

In the embodiment, the operation central coordinates which function as the central coordinates of the operation area are stored in place of the central coordinates of an object shown in FIG. 22, and the vertexes of the operation area and an operation face vector which is a normal vector of the operation face and indicative the direction of the operation face are stored in place of the boundary box of the object shown in FIG. 22. In accordance with the process of FIG. 28, the inclusion judgement section 35 conducts judgement on the operation central coordinates or all vertex coordinates in the operation area, in place of the central coordinates, to judge whether or not the operation area is included in the reachable area.

This results in that the operation area is surely included in the reachable area, and that the direction of the operation face is prevented from being opposite to that of the reachable area. Therefore, the judgement on the reachable status can be conducted more correctly.

It is not required to store the operation area separately from the storage of objects of FIG. 22, as shown in FIG. 30. For example, as shown in FIG. 31, they may be stored in the format which is a combination of those of FIGS. 22 and 30.

VI. Sixth Embodiment

Next, a workspace evaluation system according to a sixth embodiment of the invention will be described.

Figure 32:
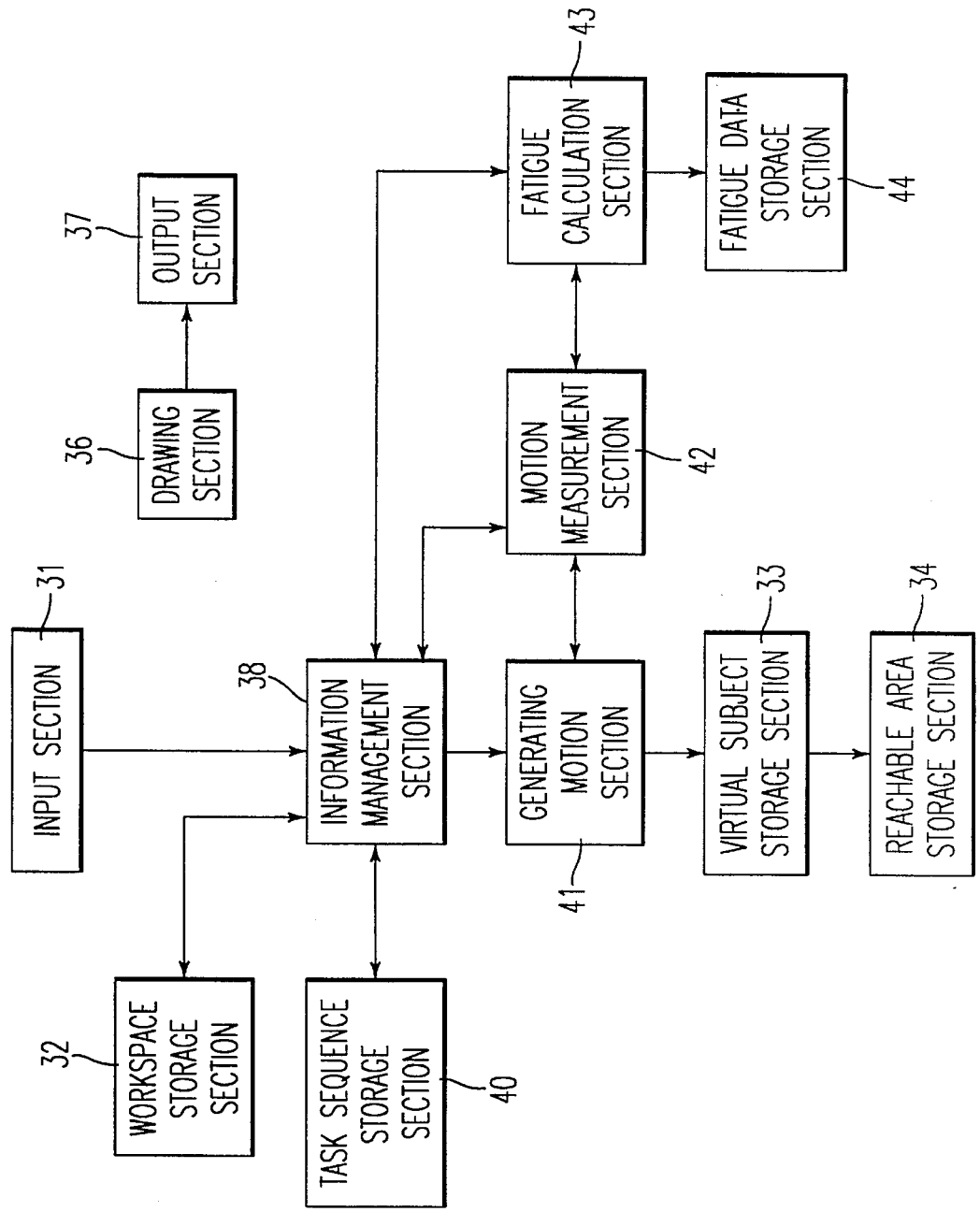
FIG. 32 is a block diagram showing the configuration of a workspace evaluation system according to a sixth embodiment of the invention.

FIG. 32 is a block diagram showing the configuration of the workspace evaluation system of the embodiment. As shown in FIG. 32, the workspace evaluation system of the embodiment comprises an input section 31, a workspace storage section 32, a virtual subject storage section 33, a reachable area storage section 34, a drawing section 36, an output section 37, an information management section 38, a task sequence storage section 40, a generating motion section 41, a motion measuring section 42, a fatigue calculating section 43, and a fatigue data storage section 44.

The input section 31, the workspace storage section 32, the virtual subject storage section 33, the reachable area storage section 34, the drawing section 36, the output section 37, and the information management section 38 are identical those of the above-described fourth embodiment, and therefore their description is omitted.

The task sequence storage section 40 stores a task sequence which is input through the input section 31, in the format of, for example, FIG. 33.

Figure 34:
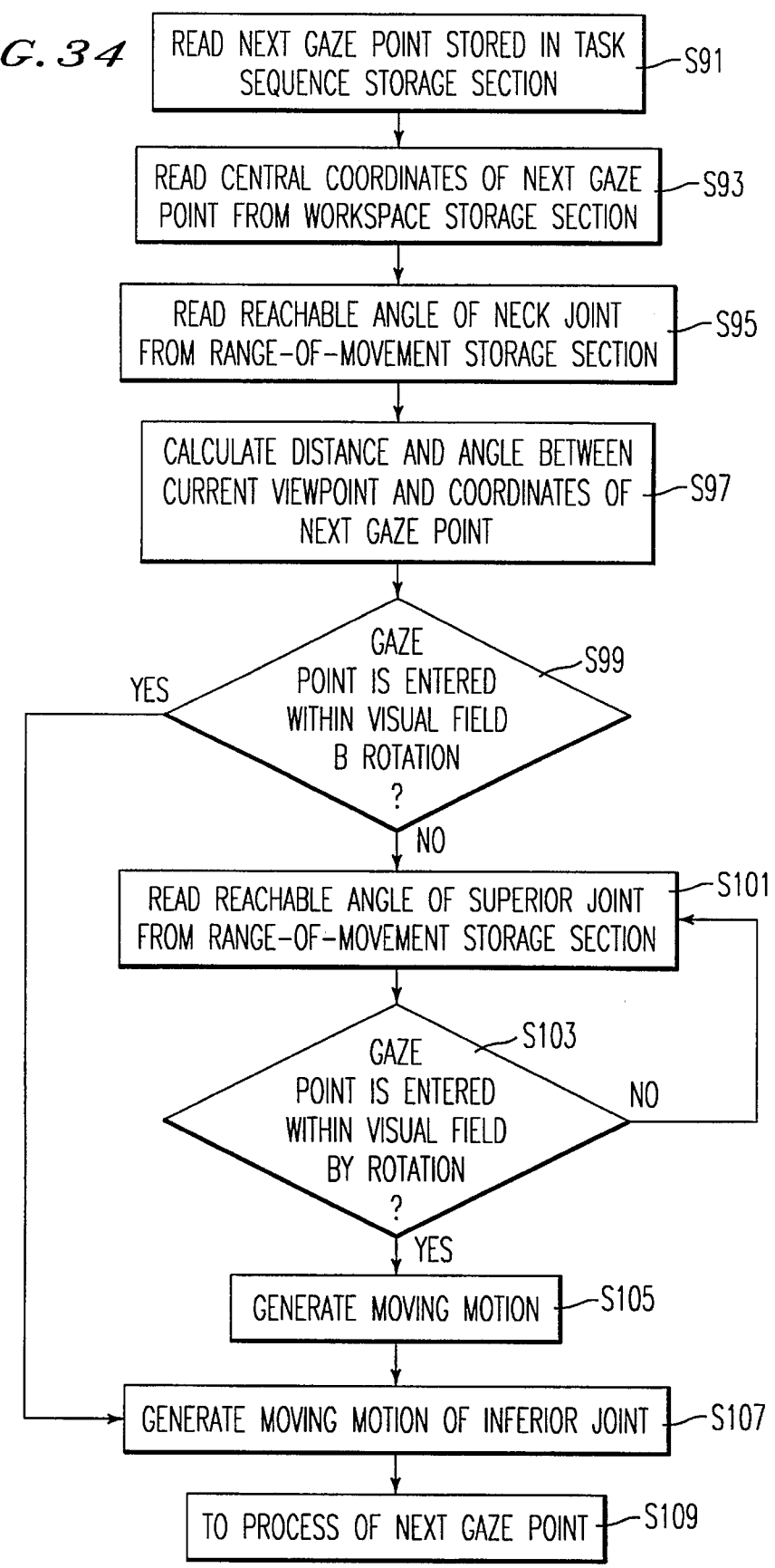
FIG. 34 is a flowchart illustrating the process sequence of a generating motion section of the sixth embodiment.

The generating motion section 41 generates a motion in the process flow such as shown in FIG. 34, in order to cause the virtual subject to operate in accordance with the work stored in the task sequence storage section 40.

The motion measuring section 4 2 measures the frequency and duration period of each kind of the motions which are generated by the generating motion section 41.

The fatigue data storage section 44 stores fatigue data of the body parts in the format of, for example, FIG. 35.

The fatigue calculating section 43 calculates the fatigue of the virtual subject due to a work, on the basis of fatigue data stored in the fatigue data storage section 44 and the frequency and duration period of each kind of the motions of the virtual subject which are measured by the motion measuring section 42.

For example, the task sequence is stored in the form of a set of a gaze target and an operation target in each work as shown in FIG. 33. In FIG. 33, names of objects are indicated. On the basis of the object names, the central coordinates of each object are read out from the workspace data stored in the workspace storage section 32 in the format of FIG. 22, or the operation central coordinates are read out from data stored in the format of FIG. 31, so that the target object at which the virtual subject gazes or should gaze and its position are known.

FIG. 34 illustrates the process flow in which the virtual subject conducts motions in accordance with the gaze point, among the motion generating process flows in the generating motion section 41. The motion generation in accordance with the operation point as shown in FIG. 6 may be conducted in a similar manner.

The generating motion section 41 first reads out the next gaze point from the task sequence which is stored in the task sequence storage section 40 in the format of, for example, FIG. 33 (step S91). The central coordinates of the gaze point are read out from the workspace data which are stored in the workspace storage section 32 in the format of, for example, FIGS. 22 or 31 (step S93). The current viewpoint is previously stored in the virtual subject storage section 33, and the distance and angle between the viewpoint and the readout coordinates of the gaze point are calculated (step S95). The reachable angle of the neck joint is read out from the data which are stored in the reachable area storage section 34 in the format of, for example, FIG. 23 (step S97). It is judged whether or not the coordinates of the gaze point are within the readout angle (step S99). If the coordinates of the gaze point are within the readout angle, the neck joint is rotated (step S107).

In contrast, if the coordinates of the gaze point are not within the readout angle, the reachable angle of the superior joint (the one superior to the neck is the waist) is read out (step S101). The judgement is conducted in the same manner as that of the neck (step S103). If no in step S103, the processes of steps S101 and S103 are repeated. The motion of the joint is generated at the time when the coordinates of the gaze point enter the readout angle (step S105). In this case, the rotation is not conducted at the full of any of the reachable angles, and the fine adjustment is conducted by the inferior joint (step S107), so that more natural motions are generated. The process of the next gaze point is conducted in the same manner (step S109).

FIG. 35 shows an example of the storage format of fatigue data. For expressing fatigue, no index is clearly established. For example, a frequency measured in a flicker test (in which the distinguishable blinking frequency is measured) is mainly used as an index of fatigue of an eye, and an energy metabolic rate, a heart rate, or an electromyogram is used as an index of fatigue of limbs.

In the embodiment, fatigue data is stored in the form of a combination of a limiting angle at which each joint feels fatigue, a limiting period and a limiting frequency at which the virtual subject is tired fatigued while maintaining that angle, symptoms developed as a result of the motion, and a fatigue obtained by converting the symptoms into an index.

When an operation is continued for t1 min. or longer while bending the waist by f1 deg. or greater, the waist becomes benumbed, resulting in that the motion of the virtual subject becomes slow. This effect is expressed by reducing the limiting angle of the waist stored in the reachable area storage section 34, by φ deg. Also the fatigue obtained by converting the symptoms into an index is stored. Similarly, when an operation is repeated for n1 times or more while bending the waist by f1 deg. or greater, a similar effect is produced. In such a case, the fatigue is stored in the format of FIG. 35.

The fatigue state of a continuous motion (a state where the waist is continued to be bent by a certain angle) is naturally different from that of an abrupt motion (a motion in which the waist is rotated from the current state). Therefore, the continuous period and the limiting frequency may be stored for each of different angles. When an operation is continued for t2 min. or longer or repeated for n2 times or more while bending the waist by f2 deg. (which is greater than f1 deg.) or greater, the waist aches so that the virtual subject enters "No active" state. The fatigue states of the other joints are stored in a similar manner.

With respect to the limiting angle and frequency, different values are stored depending the postures. These values are obtained on the basis of the data indicated in "Handbook of Human Factors" edited by the Human Engineering Society, and the experimental results obtained by Usui et al., ("Functional evaluation of a lower limbs muscle under a state where a restricted standing posture is held for a long period," Human Engineering, Vol. 20, No. 4, pp. 213–222 (1984)).

FIG. 36 shows an example of results obtained in the motion measuring section 42 by measuring motions which are generated by the generating motion section 41 in accordance with the task sequence stored in the task sequence storage section 40. In FIG. 36, indicated are the duration period and frequency for each rotation angle of the joints obtained when an operator of the height of 1 cm conducted an operation while sitting on a chair of h cm. For the convenience of illustration, the values are totalized in accordance with the angles of the stored fatigue data of FIG. 35. The manner of totalization is not restricted to this. For example, the values may be totalized in a more fine step, or in steps of, for example, 5 deg.

Hereinafter, the operation of the embodiment will be described along the process flow of FIG. 37. FIG. 37 shows an example of a process flow in which judgement is conducted on each of the joints such as the waist and the knees. Although it is supposed in the example that a process is occasionally conducted on each joint, the invention is not restricted to this. For example, unlike the configuration of FIG. 32, the motion measuring section 42 and the fatigue calculating section 43 may be disposed for each joint, so that the processes for the joints are conducted in parallel.

When measuring results of motions such as those of FIG. 36 are obtained, the process of FIG. 37 is started.

At first, fatigue data of the joint corresponding to the posture are read out from the fatigue data storage section 44 (step S111). A case where the fatigue of the waist is calculated from the table of FIG. 36 is taken as an example. In the example, the sitting posture is assumed, and therefore the data of the sitting posture stored in the format of FIG. 35 are read out.

Then, it is judged whether or not a motion was conducted at an angle greater than the maximum limiting angle of the fatigue data (step S113). In the example of FIG. 35, the maximum angle is f2, and therefore it is judged whether or not a motion greater than f2 was conducted. Since there is a motion in FIG. 36 which falls under the conditions, the process proceeds to step S115 in which judgement is conducted on the next limiting period. In FIG. 36, the period is 0.5 min., and it is not longer than the limiting period t2, and hence the process proceeds to step S119. If the period is longer than the limiting period t2, the fatigue is calculated in step S117 from the stored values of FIG. 35. As a result of the calculation, the fatigue is 4 in the example of FIG. 35.

On the other hand, it is judged in step S119 whether or not the frequency is greater than the limiting frequency. Since the frequency of 3 times is smaller than the limiting frequency of n2 times, the process proceeds to step S121 wherein it is judged whether or not there is an angle smaller than the limiting angle which has been used in the judgement. In the table of FIG. 35, there is f1 which is smaller than f2, and hence the process proceeds to step S123. In step S123, it is judged whether or not there is a motion exceeding the limiting angle. In the example of FIG. 36, there is a motion exceeding the limiting angle, and hence the process proceeds to step S115. In step S115, it is judged whether or not the motion period is longer than the limiting period. Although the motion period when the angle is between f1 and f2 is 5 min. in the example of FIG. 36, the judgement is conducted on whether or not a period of 5.5 min. that is obtained adding the motion period of 0.5 min. during which the angle is greater than f2 to the motion period is longer than the limiting period of t1 min. Since the total period is not longer the limiting period in the example, the process proceeds to step S119 where it is judged whether or not the frequency is greater than the limiting frequency. In the example of FIG. 36, although the number of motions in which the angle is between f1 and f2 is six, the number of motions in which the angle is greater than f2 is three, and the total of the two numbers is nine. Therefore, it is assumed that the motion number is greater than n1. Accordingly, the motion number is greater than the limiting frequency, and the process proceeds to step S117 to calculate the fatigue of FIG. 35. In this case, the fatigue is 2. This value is sent to the information management section 38 and displayed on the output section 37.

When the fatigue is calculated, the process of the fatigue calculating section 43 is completed.

In contrast, if the frequency is not greater than the limiting frequency in step S119, it is again judged whether or not there is a next limiting angle (step S121). There is no limiting angle smaller than f1 in the example of FIG. 35. In this case, hence, the process is completed.

As described above, according to the embodiment, differences in fatigue can be anticipated on the basis of differences in motions due to a positional change of a device. Therefore, various fatigue problems such as asthenopia and lumbago owing to the arrangement of devices or the use of the devices can be previously considered.

VII. Seventh Embodiment

Next, a workspace evaluation system according to a seventh embodiment of the invention will be described.

Figure 39:
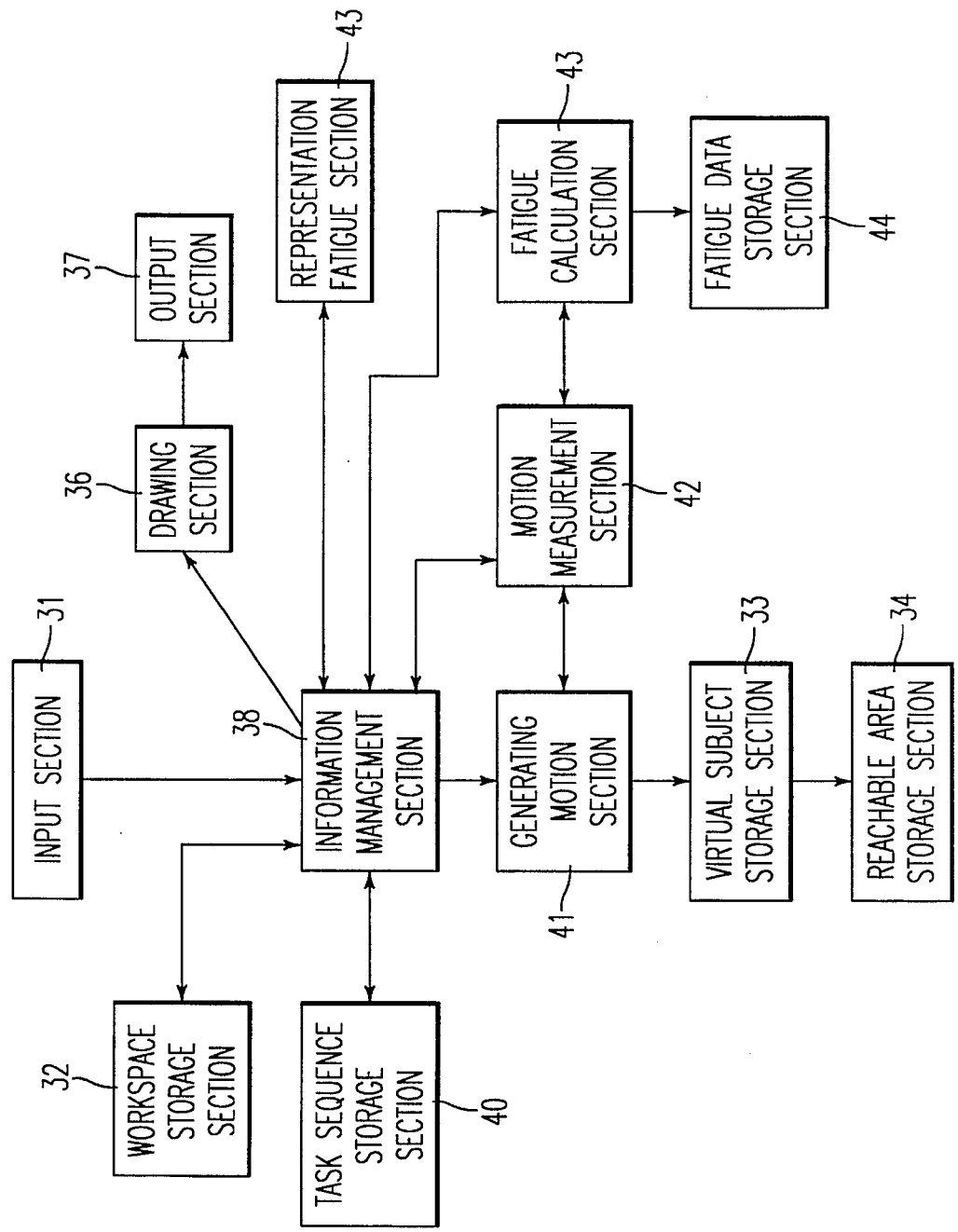
FIG. 39 is a block diagram showing the configuration of a workspace evaluation system according to a seventh embodiment of the invention.

FIG. 39 is a block diagram showing the configuration of the workspace evaluation system of the embodiment. The workspace evaluation system of the embodiment has a configuration in which a representing fatigue section 45 is added to that of the sixth embodiment shown in FIG. 32. In the sixth embodiment, the fatigue is calculated. By contrast, in the present embodiment, the representing fatigue section 45 for reflecting the calculated fatigue in the motion is further provided to visualize an effect of the calculated fatigue on the motion.

After the step in which the fatigue calculating section 43 calculates the fatigue, the representing fatigue section 45 conducts a process in which the symptom stored as shown in FIG. 35 is applied to conduct the visualization (step S125 of FIG. 38). More specifically, in the above-described example of the motion of the waist, the fatigue is calculated as 2 in step S117. In the symptoms of FIG. 35, it is previously stored to reduce the reachable angle by $\phi$ deg. On the basis of this, therefore, the representing fatigue section 45 sends to the information management section 38 an instruction indicating that the limiting angle of the waist stored in the reachable area storage section 34 is to be reduced by $\phi$ deg. The information management section 38 conducts a process to temporarily reduce by $\phi$ deg. the limiting angle of the waist stored in the reachable area storage section 34. As a result, the motion generated at the next time has a reduced reachable limiting angle, resulting in a small motion area. This visualizes the state where the motion of the waist is made slower by numbness. When a symptom of the fatigue is once reflected in the motion, the process of the representing fatigue section 45 is completed.

Similarly, when the fatigue of the waist is 4, the symptom in FIG. 35 is "No active," and therefore the representing fatigue section 45 sends an instruction for the stop of the motion generation to the information management section 38. Then, the information management section 38 temporarily stops the process of the generating motion section 41.

When a predetermined multiple of the limiting period (e.g., 3 times of the period) has elapsed, the above-mentioned reduction of the angle of the reachable area and the stoppage of the motion generation are canceled. The manner of the cancellation may be selected from various ones. For example, these values may be returned to the original ones after the elapse of a predetermined period, and the motion generation may be started by one action. Alternatively, these values may be returned to the original ones in the form of a step function, a linear function, or a logarithmic function. In short, the manner is selected so that the reduction of the muscular fatigue is approximated by a function.

In the embodiment, as shown in FIG. 35, symptoms are stored in such a manner that the angle of the reachable area is reduced. The invention is not restricted to this. For example, in such a manner that the motion is made slower by numbness, a variable which affects the speed of the motion generation may be stored as a symptom, and the representing fatigue section 45 may reduce the speed of the motion generation on the basis of the stored variable.

VIII. Eighth Embodiment

Next, a workspace evaluation system according to an eighth embodiment of the invention will be described.

Figure 40:
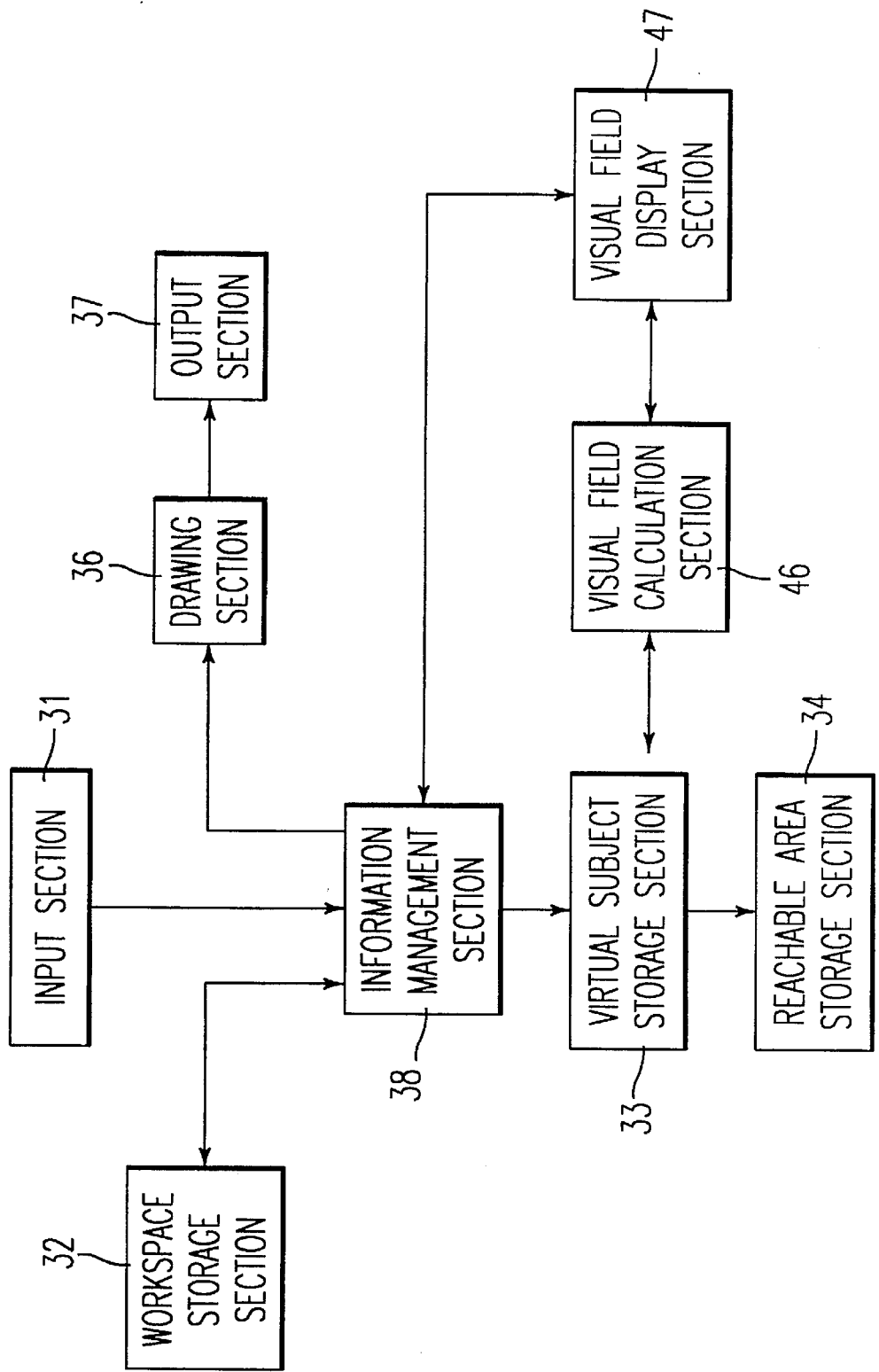
FIG. 40 is a block diagram showing the configuration of a workspace evaluation system according to a eighth embodiment of the invention.

FIG. 40 is a block diagram showing the configuration of the workspace evaluation system of the embodiment. As shown in FIG. 40, the workspace evaluation system of the embodiment comprises an input section 31 for instructing the input of shape data and the switchover of the visual field, a workspace storage section 32 for storing shape data and an arrangement which are input through the input section 31, a virtual subject storage section 33 for storing shape data and attributes of virtual subjects, a reachable area storage section 34 for storing the reachable area of each joint such as the neck of each virtual subject, a visual field calculating section 46 for calculating the visual field of each virtual subject, a visual field display section 47 for displaying the visual field calculated by the visual field calculating section 46, a drawing section 36 for drawing the visual field, the workspace, and the virtual subject, and an output section 37.

The visual field calculating section 46 connects the viewpoint (corresponding to point q in FIG. 27) of each virtual subject with the gaze point (corresponding to (x2, y2, z2) of FIG. 27), and calculates the portion included in the view cone (corresponding to the circular cone of FIG. 27). The visual field display section 47 displays the calculating results.

Figure 41A:
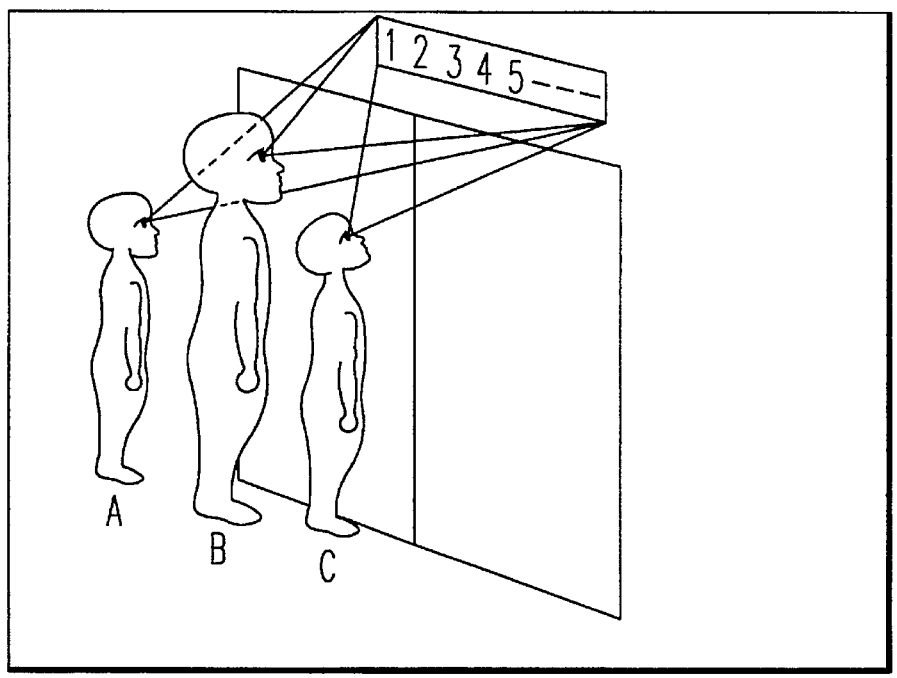
FIGS. 41(a)–41(c) are diagrams showing an example of a display of the eighth embodiment.
Figure 41B:
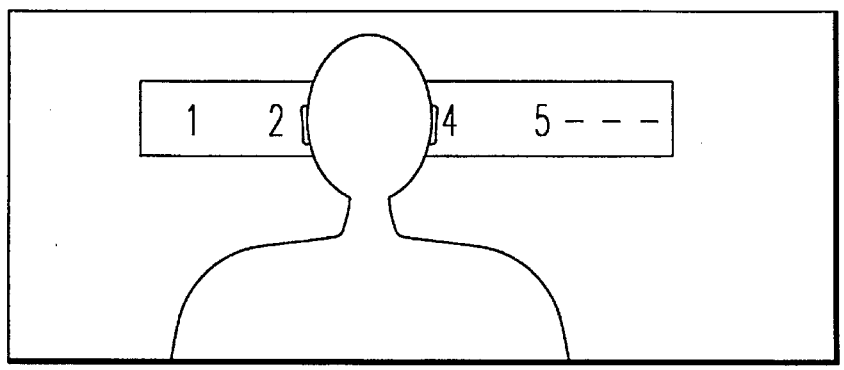

Hereinafter, a simulation of the visual field in the case where three virtual subjects (A, B, C) stand before an elevator as shown in FIG. 41 will be described as an example. FIG. 41(a) shows an example of a display showing the whole of the workspace.

It is assumed that the user directly indicates through the input section 31 virtual subject A displayed on the output section 37, to instruct the display of the visual field of virtual subject A. This instruction is sent through an information management section 38 to the visual field calculating section 46 which in turn calculates the visual field of virtual subject A. As a result, since virtual subject A is short, the visual field calculated by the visual field calculating section 46 is displayed on the output section 37 as shown in, for example, FIG. 41(b). It will be noted that virtual subject B obstructs the view of virtual subject A so that virtual subject A cannot see the position indicator of the elevator. Alternatively, FIG. 41(a) may not be displayed and FIG. 41(b) only may be displayed, or FIG. 41(b) may be displayed so as to be superposed on a part of FIG. 41(a).

Figure 41C:
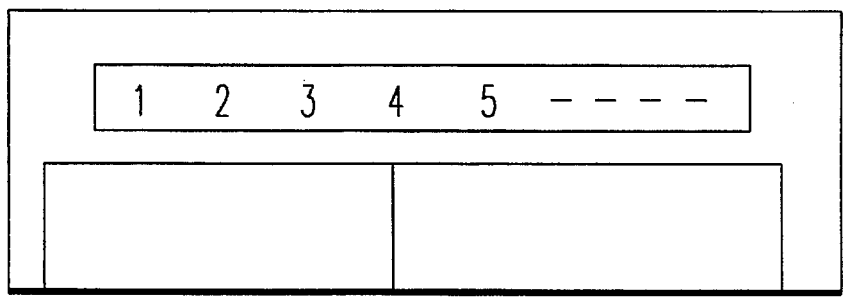

When the display of the visual field of virtual subject B is then instructed in the same manner, the visual field of virtual subject B is displayed as shown in FIG. 41(c). It will be noted that, since virtual subject B is high, virtual subject B can sufficiently see the position indicator even when virtual subject C stands before virtual subject B.

Visual fields of a plurality of virtual subjects may be simultaneously displayed.

As described above, according to the embodiment, the display can freely be switched to that obtained in the viewpoint of each of plural virtual subjects in the workspace so that the arrangement of devices, etc. is confirmed. Therefore, it is possible to check discomfort which a short person may undergo, whereby possible problems can be eliminated in advance.

In the fourth to eighth embodiments described above, an example in which the contents of the motion and operation of a virtual subject are input by the user interactively and sequentially through the input section has been described. The invention is not restricted to this. In the same manner as the first to third embodiments, a scenario of the contents of the motion and operation of a virtual subject, etc. may previously be set, and the workspace evaluation may be conducted according to the scenario. The reachable area is set for a virtual subject, and then the workspace evaluation is conducted. Alternatively, the workspace evaluation may be conducted while the reachable area is set for an object in the workspace.

As described above in conjunction with embodiments, according to the invention, although the generation of a three-dimensional workspace requires a high cost for initial data input, the data can be reused, and therefore subjects of various physical conditions can easily be obtained as virtual subjects so that evaluation is conducted at a very low cost as compared with workspace evaluation using real subjects. Even in the case where evaluation using real subjects such as a child or a person using a wheelchair is difficult, virtual subjects can easily cope with such evaluation.

In evaluation of a special kind, for example, evaluation is conducted in an environment in which a plurality of subjects are forcibly thrust into a small space, or on a work which requires a very long period and is very tiresome, real subjects are forced to physically overdo themselves, whereby the physical control is made difficult and required to be carefully conducted. Even in such evaluation, virtual subjects are free from these problems, and can easily be conducted, thereby attaining an excellent effect.

The invention is not restricted to the above-described embodiments, and can be executed in various modified manner without departing from the spirit of the invention.

What is claimed as new and is desired to be secured by Letters Patent of the United States is:

1. A system for evaluating a virtually produced workspace wherein various objects are arranged, by causing a predetermined operator model to conduct a motion in said workspace, said system comprising:

first setting means for setting a sequence in which said operator model conducts a motion in said workspace, and for setting objects at which said operator model is to gaze when said operator model conducts a motion in accordance with said sequence; and display means for visibly displaying on a screen a visual field area of each of said objects which is set by said first setting means, a visual field area being defined when said operator model gazes at an object which is set.

2. The system of claim 1, further comprising:

second setting means for arbitrarily setting physical features of said operator model; and generation means for generating a new operator model on the basis of physical features which are set by said second setting means, whereby a visual field area for each of said objects which have been set is newly displayed.

3. The system of claim 2, further comprising calculation means for calculating a difference between a new visual field area obtained when physical features are newly set, and a visual field area obtained before the process of newly setting physical features, wherein a calculating result of said calculation means is displayed.

4. The system of claim 2, wherein said physical features which are set by said second setting means include a height, a sitting height, and a range of movement of each body part.

5. The system of claim 1, further comprising:

means for changing an arrangement of objects arranged in said workspace, whereby a visual field area for each of said objects is newly displayed.

6. The system of claim 1, further comprising third setting means for arbitrarily setting said visual field area.

7. The system of claim 1, further comprising fourth setting means for arbitrarily setting a sequence in which said operator model conducts a motion in said workspace.

8. The system of claim 7, wherein the setting of a sequence in which said operator model conducts a motion by said fourth setting means is conducted by displaying instructions on said screen.

9. The system of claim 1, wherein a display of said visual field area comprises a view of said operator model and is located at a position on said screen which is outside said workspace.

10. The system of claim 1, further comprising:

judging means for judging whether or not a visual field area of an object which is disposed in said workspace and at which said operator model is to gaze is interfered by another object, wherein a judging result of said judging means is displayed.

11. A system for evaluating a virtually produced workspace wherein various objects are arranged, by causing a predetermined operator model to conduct a motion in said workspace, said system comprising:

definition means for defining a task sequence of said operator model in said workspace;

execution means for executing said task sequence defined by said definition means;

designation means for designating objects at which said operator model caused to conduct a motion by said execution means is to gaze;

counting means for, when said operator model gazes at an object designated by said designation means in a task defined by said definition means, counting a number of interferences which are introduced to a visual field area of said object by another object; and display means for displaying a counting result obtained by said counting means.

12. The system of claim 11, wherein said counting result displayed by said display means is displayed for each of said objects at which said operator model gazes.

13. A system for evaluating a virtually produced workspace wherein various objects are arranged, by causing a predetermined operator model to conduct a motion in said workspace, said system comprising:

definition means for defining a motion of said operator model in said workspace;

execution means for executing said motion defined by said definition means; and reexecution means for, when a change occurs in an arrangement of said various objects, in said operator model, or in said motion of said operator model, newly executing a motion which is defined in accordance with said change.

14. The system of claim 13, further comprising: fifth setting means for setting a position of an object disposed in said workspace at which said operator model is to gaze in accordance with said motion of said operator model which is defined by said definition means.

15. The system of claim 14, further comprising:

display means for displaying a visual field area in accordance with a visual field angle which is previously set based on a position of said object which is set by said fifth setting means.

16. The system of claim 13, wherein said change of said operator model is conducted by changing physical features of said operator model.

17. A system for evaluating a virtually produced workspace wherein various objects are arranged, by causing a predetermined operator model to conduct a motion in said workspace, said system comprising:

first definition means for defining a reachable area of each part of said operator model;

second definition means for defining a motion of said operator model in said workspace with respect to one of said various objects to be reached;

execution means for executing said motion of said operator model which is defined by said second definition means;

judging means for, when said execution means executes said motion of said operator model, judging whether or not said one of said various objects to be reached is within said reachable area defined by said first definition means; and display means for displaying a judging result of said judging means.

18. The system of claim 17, further comprising:

sixth setting means for setting a face or a position of said one of said various objects to be reached, wherein said judging means judges whether or not said face or position of said one of said various objects to be reached which is set by said sixth setting means is within said reachable area.

19. A system for evaluating a virtually produced workspace wherein various objects are arranged, by causing a predetermined operator model to conduct a motion in said workspace, said system comprising:

definition means for defining a motion of said operator model in said workspace with respect to said various objects;

execution means for executing said motion defined by said definition means;

classifying and measuring means for classifying motions executed by said execution means as types of motions, and for measuring the number of said motions classified and a duration period of each of said motions; and display means for displaying a result of said classifying and measuring means.

20. The system of claim 19, further comprising:

calculation means for calculating a fatigue value in accordance with a value which is previously set based on a result obtained by said classifying and measuring means; and display means for displaying a result of said calculation means.

21. The system of claim 20, wherein, said calculation means calculates a fatigue value in accordance with data of a visual field angle of said operator model during a motion.

22. A system of evaluating a virtually produced workspace wherein various objects are arranged, by causing a predetermined operator model to conduct a motion in said workspace, said system comprising:

input means for inputting conditions relating to said operator model and said workspace;

condition storing means for storing conditions which are input via said input means;

sequence input means for inputting a task sequence in said workspace;

sequence storing means for storing said task sequence which is input via said sequence input means;

motion calculation means for calculating a motion of said operator model on the basis of said task sequence stored in said sequence storing means and said conditions stored in said condition storing means; and display means for displaying said workspace with respect to said motion of said operator model which is calculated by said motion calculation means.

23. A system for evaluating a virtually produced workspace wherein various objects are arranged, by causing a predetermined operator model to conduct a motion in said workspace, said system comprising:

input means for inputting conditions relating to said operator model and said workspace;

condition storing means for storing conditions which are input via said input means;

sequence input means for inputting task sequence in said workspace;

sequence storing means for storing said task sequence which is input via said sequence input means;

interference judging means for conducting an interference check on a visual field of said operator model and on interference targets in accordance with said task sequence stored in said sequence storing means and said conditions stored in said condition storing means;

interference counting means for counting a number of interferences which are judged by said interference judging means for each of said interference targets stored in said condition storing means; and display means for displaying a count result of said interference counting means.

24. A system for evaluating a virtually produced workspace wherein various objects are arranged, by causing a predetermined virtual subject to conduct a motion in said workspace, said system comprising:

condition storing means for storing workspace data which include a shape of at least one of said various objects of said workspace, an arrangement of said one of said various objects, a shape of said workspace wherein said one of said various objects is disposed, and virtual subject data which include an arrangement and a shape of a virtual subject conducting work in said workspace and data for generating motion of said virtual subject;

display means for displaying said workspace and said virtual subject;

designation means for designating one of said various objects which is to be operated by said virtual subject in said workspace, or a plurality of said various objects which are to be operated by the virtual subject and a sequence of said plurality of said various objects; and operability judging means for judging whether or not said virtual subject can operate said one of said various objects or said plurality of said various objects designated by said designation means.

25. The system of claim 24, wherein said display means further displays a reachable area of said virtual subject which is stored in said condition storing means, and wherein said operability judging means comprises inclusion judging means for judging whether or not said one of said various objects or said plurality of said various objects designated by said designation means is within said reachable area.

26. The system of claim 25, wherein said condition storing means further stores an operable area for an object which represents an operation target, said display means further displays said operable area, and said operability judging means further judges whether or not said operable area of said one of said various objects or said plurality of said various objects designated by said designation means is within said reachable area via said inclusion judging means.

27. A system for evaluating a virtually produced workspace wherein various objects are arranged, by causing a predetermined virtual subject to conduct a motion in said workspace, said system comprising:

condition storing means for storing workspace data which include a shape of at least one of said various objects of said workspace, an arrangement of said one of said various objects, a shape of said workspace where said one of said various objects is disposed, and virtual subject data which include an arrangement and a shape of a virtual subject conducting work in said workspace and data for generating motion of said virtual subject;

display means for displaying said workspace and said virtual subject;

work designation means for designating one work in said workspace, or plural works and a sequence of said plural works;

motion generation means for generating a motion of said virtual subject in accordance with said one work or said plural works designated via said work designation means;

motion measuring means for measuring a frequency and a duration of each motion generated by said motion generation means, fatigue data storing means for storing fatigue data in accordance with said frequency and said duration of each of said motions; and fatigue calculation means for calculating a fatigue of said virtual subject on the basis of each motion measured by said motion measuring means, and on the basis of fatigue data stored in said fatigue data storing means.

28. The system of claim 27, wherein said motion generation means comprises representing fatigue means for changing a generated motion in accordance with a fatigue calculated by said fatigue calculation means, and executes a motion generation reflecting said fatigue via said representing fatigue means, and wherein said display means further displays a motion which is generated reflecting said fatigue.

29. A system for evaluating a virtually produced workspace wherein various objects are arranged, by causing a predetermined operator model to conduct a motion in said workspace, said system comprising:

condition storing means for storing workspace data which include a shape of at least one of said various objects of said workspace, an arrangement of said one of said various objects, a shape of said workspace where said one of said various objects is disposed, and virtual subject data which include an arrangement and a shape of a virtual subject conducting work in said workspace and data for generating motion of said virtual subject;

display means for displaying said workspace and said virtual subject;

designation means for designating one of said various objects which is to be operated by said virtual subject in said workspace, or a plurality of said various objects which are to be operated and an operation sequence of said plurality of said various objects;

virtual subject visual field display means for displaying a visual field from an individual viewpoint of one or plural virtual subjects existing in said condition storing means; and visual field designation means for designating a visual field of a virtual subject which is to be displayed to said virtual subject visual field display means.

30. A method for evaluating a virtually produced workspace wherein various objects are arranged, by causing a predetermined operator model to conduct a motion in said workspace, said method comprising the steps of:

setting a sequence in which said operator model conducts a motion in said workspace and objects at which said operator model is to gaze when said operator model conducts said motion in accordance with said sequence; and displaying a visual field area on a screen for each of said objects which is set, said visual field area being obtained when said operator model gazes at an object which was set.

31. The method of claim 30, further comprising the steps of:

arbitrarily setting physical features of said operator model;

generating a new operator model on the basis of said physical features which are set; and newly displaying a visual field area for each object which was set.

32. The method of claim 31, further comprising the steps of:

calculating a difference between a new visual field area obtained when said physical features are newly set and a visual field area obtained before a process of newly setting said physical features; and displaying a calculated result.

33. The method of claim 31, further comprising the steps of:

judging whether or not a visual field area of an object which is disposed in said workspace and at which said operator model is to gaze is interfered by another object; and displaying a judged result.

34. The method of claim 30, further comprising the steps of:

changing an arrangement of said various objects arranged in said workspace; and newly displaying a visual field area for each object which was set.

35. A method for evaluating a virtually produced workspace wherein various objects are arranged, by causing a predetermined operator model to conduct a motion in said workspace, said method comprising the steps of:

defining a task sequence of said operator model in said workspace;

executing said task sequence which is defined;

designating an object at which said operator model is to gaze;

counting a number of interferences which are produced for a visual field area of said object by another object when said operator model gazes at a designated object in accordance with said task sequence; and displaying a counted result.

36. A method for evaluating a virtually produced workspace wherein various objects are arranged, by causing a predetermined operator model to conduct a motion in said workspace, said method comprising the steps of:

defining a motion of said operator model in said workspace;

executing said motion defined; and newly executing a motion which is defined on the basis of a change of an arrangement of said various objects, said operator model, or a motion of said operator model.

37. The method of claim 36, further comprising the step of setting a position of an object in said workspace toward which said operator model is to gaze, in accordance with a defined motion of said operator model.

38. The method of claim 37, further comprising the step of displaying a visual field area in accordance with a visual field angle which is previously set based on a position of an object which is set.

39. A method for evaluating a virtually produced workspace wherein various objects are arranged, by causing a predetermined operator model to conduct a motion in said workspace, said method comprising the steps of:

defining a reachable area of each part of said operator model;

defining a motion of said operator model in said workspace with respect to one of said various objects to be reached;

executing said motion of said operator model which is defined;

judging whether or not said one of said various objects to be reached is within said reachable area defined while executing said motion of said operator model; and displaying a judging result.

* * * * *